United States Patent
Yamaguchi

(10) Patent No.: US 6,927,625 B2
(45) Date of Patent: *Aug. 9, 2005

(54) HIGH FREQUENCY CIRCUIT USING HIGH OUTPUT AMPLIFIER CELL BLOCK AND LOW OUTPUT AMPLIFIER CELL BLOCK

(75) Inventor: Keiichi Yamaguchi, Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/927,165

(22) Filed: Aug. 27, 2004

(65) Prior Publication Data

US 2005/0024136 A1 Feb. 3, 2005

Related U.S. Application Data

(63) Continuation of application No. 09/826,361, filed on Apr. 5, 2001, now Pat. No. 6,804,500.

(30) Foreign Application Priority Data

Apr. 5, 2000 (JP) ........................................ 2000-103784

(51) Int. Cl.$^7$ ................................................. H03F 3/68
(52) U.S. Cl. .................................. 330/124 R; 330/295
(58) Field of Search ............................ 330/295, 124 R, 330/307; 455/127.1, 127.2, 127.3, 127.4, 232.1, 253.2, 341, 342, 126

(56) References Cited

U.S. PATENT DOCUMENTS

| 4,631,493 | A | | 12/1986 | Vendelin et al. |
| 5,903,854 | A | | 5/1999 | Abe et al. |
| 6,028,485 | A | * | 2/2000 | Sigmon et al. ............. 330/295 |
| 6,069,525 | A | | 5/2000 | Sevic et al. |
| 6,181,208 | B1 | | 1/2001 | King et al. |
| 6,615,028 | B1 | | 9/2003 | Loke et al. |
| 6,636,115 | B2 | | 10/2003 | Kim et al. |
| 6,750,721 | B2 | * | 6/2004 | Patterson .................... 330/295 |
| 6,816,015 | B2 | * | 11/2004 | Zhang et al. ................ 330/295 |

* cited by examiner

Primary Examiner—Henry Choe
(74) Attorney, Agent, or Firm—Oblon, Spivak, McClelland, Maier & Neustadt, P.C.

(57) ABSTRACT

A high frequency circuit capable of realizing a power amplifier with a wide dynamic range in which it is hard to degrade the power addition efficiency at low output is formed by using a high output amplifier cell block configured to amplify input signals at a time of high output power, in which a DC power source voltage is supplied in parallel to first amplifier cells that are connected in parallel AC-wise with respect to input/output signals, and a low output amplifier cell block configured to amplify input signals at a time of low output power, in which a DC power source voltage is supplied in series to second amplifier cells that are connected in parallel AC-wise with respect to input/output signals.

12 Claims, 19 Drawing Sheets

EFFICIENCY DEGRADATION AT LOW POWER OUTPUT

DC INPUT POWER VERSUS RF OUTPUT POWER

CONNECTION DIAGRAM

GAIN DIAGRAM

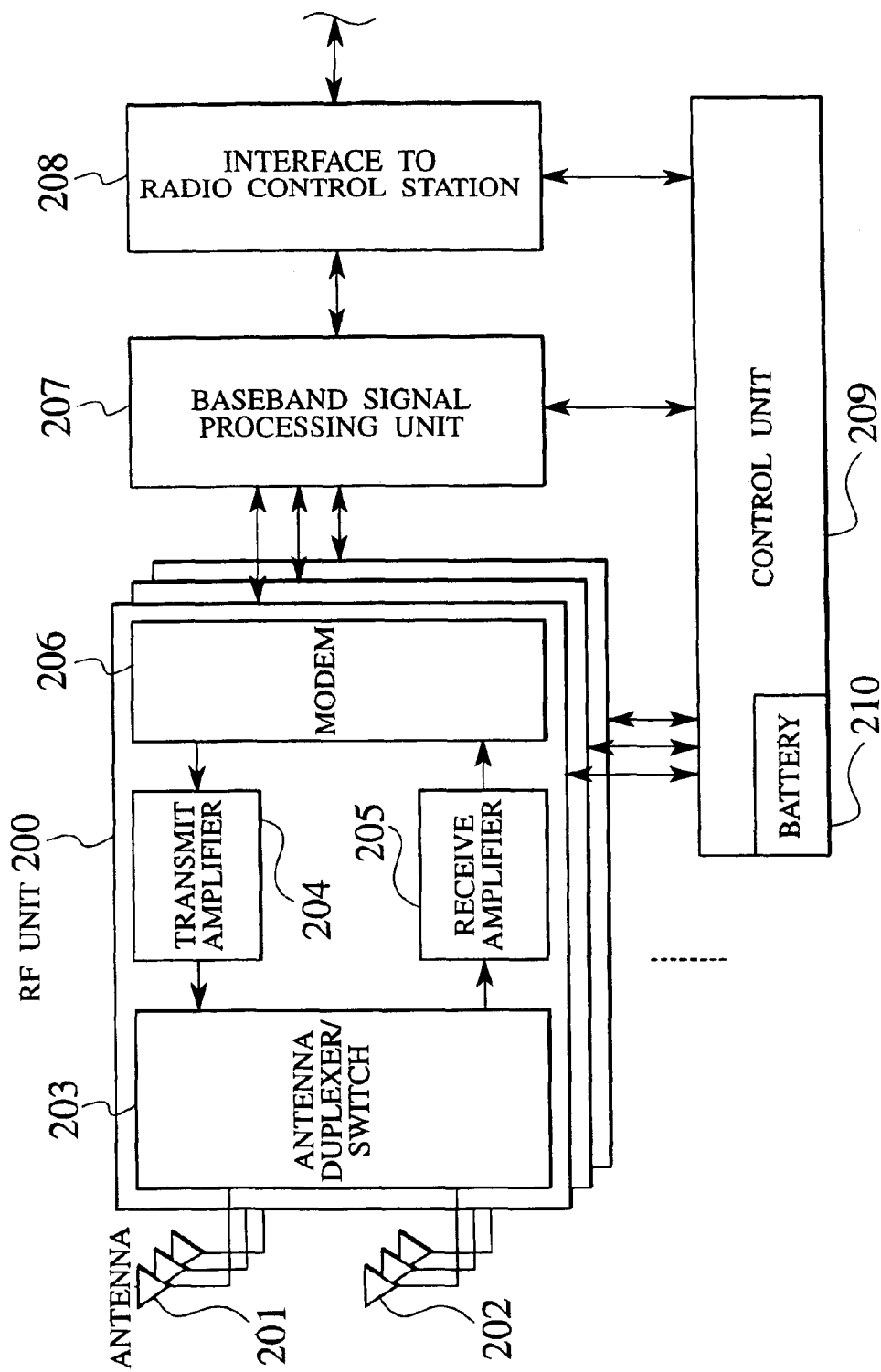

HIGH FREQUENCY CIRCUIT USING HIGH OUTPUT AMPLIFIER CELL BLOCK AND LOW OUTPUT AMPLIFIER CELL BLOCK

This application is a continuation of Ser. No. 09/826,361 filed Apr. 5, 2001 now U.S. Pat. No. 6,804,500.

BACKGROUND OF THE INVENTION

1. Field of the Invention

The present invention relates to a high frequency circuit for realizing a high efficiency power amplifier with a wide output power range which is suitable for use in a portable telephone or the like, for example, and a communication device using such a high frequency circuit.

2. Description of the Related Art

In general, the power amplifier has an efficiency which lowers at low output, because its power addition efficiency increases as the output power is increased and takes the maximum value in a vicinity of the saturation point of the output power. FIG. 1A shows an exemplary relationship between the efficiency and the output power at low output in a general amplifier. Here, the efficiency is a value obtained by dividing an RF (high output) output power by a DC (direct current) input power, which corresponds to a collector efficiency of a bipolar transistor and a drain efficiency of a field effect transistor. FIG. 1B shows an inverse of the efficiency shown in FIG. 1A in the logarithmic scale.

As shown in FIGS. 1A and 1B, the efficiency is sequentially degraded from 72% at the output power of 30 dBm (dBmW to be accurate, but will be abbreviated as dBm hereafter) to 21.8% at the output power of 20 dBm, 4.7% at the output of 10 dBm, and 1.5% at the output power of 5 dBm. Accordingly, a ratio of the DC input power with respect to the RF output power sequentially increases to 1.4 at the 30 dBm output, 4.6 at the 20 dBm output, 21.2 at the 10 dBm output, and 67.1 at the 5 dBm output.

The cause of this degradation of the efficiency at low output will now be explained using a simplified ideal transistor model. FIGS. 2A and 2B show graphs indicating a relationship between current and voltage in the alternating currents.

In FIGS. 2A and 2B, it is assumed that a load line is as indicated by a chain line KB, the output voltage is in a form of a sinusoidal wave with an average value set at a bias voltage, and the output current is in a form of a half-wave rectified wave Iout(t). Note that a point B in FIGS. 2A and 2B corresponds to the bias point.

FIGS. 2A and 2B show the case of the class B operation. The RF output power is given by a product of an effective value of the fundamental wave component Vout of the output power and an effective value of the fundamental wave component $I_1(t)$. One half of an area of a rectangle with a point R and a point B as diagonal corners corresponds to the RF output power.

The DC input power is given by a product of the bias and an average value of the output current Iout(t), which corresponds to an area of a rectangle with a point D and a point B as diagonal corners (which will be referred to as a rectangle DB hereafter) in FIGS. 2A and 2B. The efficiency is given by a ratio of these two areas.

With respect to the case of FIG. 2A, in the case of FIG. 2B, the current amplitude and the voltage amplitude are both reduced to ½ so that the output power is ¼. On the other hand, the direct current is given by an average value of the RF current so that it is also reduced to ½ but the direct current voltage is fixed at a point B, so that the area of the rectangle DB is ½. As a result, the efficiency is reduced to ½ whenever the RF output power is reduced to ¼ (−6 dB). In practice, a rate of the degradation of the efficiency is greater than ½ due to the influence of the knee voltage and the fact that the operation is actually the class AB operation.

Conventionally, one way of compensating such a degradation of the efficiency at low output is to use an amplifier circuit as shown in FIG. 3A.

Namely, as shown in FIG. 3A, in this conventional amplifier circuit, a plurality of amplifiers with different maximum output powers, AMP1 (with maximum output of −20 dBm) AMP2 (with maximum output of 5 dBm), and AMP3 (with maximum output of 30 dBm) are arranged in series, while bias circuits 75 and 76 are provided with respect to the AMP2 and AMP3 of the later stages, and a connection form is selected by switching switch circuits S71, S72, S73 and S74, so as to realize an appropriate power amplification.

However, as can be seen from a gain diagram shown in FIG. 3B, in the conventional amplifier circuit described above, there are cases for outputting the power that is lower by as much as 25 dB at most with respect to the maximum output power 30 dBm of AMP3 or the maximum output power 5 dBm of AMP2 in a range (B in FIG. 3B) of the output power between 5 dBm and 30 dBm, so that the degradation of the efficiency will be caused. Similarly, even in a range (D in FIG. 3B) of the output power between −20 dBm and 5 dBm, there is an increase of the consumed power due to the degradation of the efficiency although it is not as much as that in the range B described above.

Also, as shown in FIG. 3A, the gain of each stage is usually about 25 dB, so that it is difficult to improve the degradation of the efficiency considerably by the method described above. In this regard, it is also possible to consider a method using a greater number of amplification stages, but in such a case, the minimum unit for the amplification stages that is practically feasible is expected to be 10 dB to 15 dB corresponding to the gain per one stage of a transistor.

In this case, there is a need to align the input/output impedance of each stage, and a conversion up to a higher impedance may be required instead of the ordinarily required conjugate matching of adjacent transistors, which can cause an increase of losses or a complication of a circuit configuration.

For this reason, conventionally, a method for optimizing the load line of the amplifier of arbitrary stage according to the output power has been proposed. FIG. 4A shows a circuit for realizing this conventional optimization method schematically.

A circuit shown in FIG. 4A realizes a method for switching an effective transistor size of the amplifier, where a plurality of amplifiers 14a and 14b are connected in parallel, while input switches Si1 and Si2 and output switches So1 and So2 are provided at the input side and the output side of these transistors 14a and 14b respectively, and input signals entered from a variable matching circuit 13i are entered into a transistor with appropriate gate length or emitter area by switching the switches Si1, Si2, So1 and So2 and amplified signals are outputted to a variable matching circuit 13o. At this point, the matching to a matching condition suitable for a respective transistor size is made by the variable matching circuits 13i and 13o.

In such a conventional amplifier circuit, as a result of selectively combining a plurality of transistors 14a and 14b appropriately, the unnecessary power consumption can be reduced by reducing the number of transistors that are effective at low output power so as to reduce currents and vary the maximum value thereby maximizing the efficiency at the low output.

In the circuit shown in FIG. 4A, the maximum output power is reduced to ½ by reducing the transistor size to ½, so that the efficiency can be maximized for the power in a narrow range of about 3 dB. However, in order to control a range as wide as 24 dB as in the case of FIGS. 3A and 3B, 24/3=8 so that as many as $2^8$=256 of divided transistor cells would be required.

Also, in the circuit shown in FIG. 4A, there is a need to satisfy the matching condition even when the slope of the load line changes from BK1 to BK2, so that there is a need to change the matching circuit simultaneously. Such a variable matching circuit can be realized by any of a circuit shown in FIG. 5A in which a variable inductance 11 and a variable capacitor 12 are combined, a circuit shown in FIG. 5B in which distributed constant circuits 14 to 16 are connected through switches S1 and S2, and a circuit shown in FIG. 5C in which matching circuits 13a and 13b of different types are switched by switches Si11, Si12, So11 and So12. However, the mechanisms of these circuits are all complicated so that the increase of an implementation area can be caused. Also, there are losses in the switch, the variable inductance, and the variable capacity, so that their use in the matching circuit of the power amplifier is not preferable as they can cause a degradation of the efficiency.

Another way of compensating the degradation of the efficiency at low output is to use an amplifier circuit as shown in FIG. 6A. This amplifier circuit realizes a method for optimizing the power source voltage to be supplied to the amplifier according to the output power, where a voltage Vdc to be applied to a transistor 17 is adjusted by variable voltage sources 9 and 10 so as to move the bias point from B2 to B1 and change the load line from K2B2 to K1B1 as shown in FIG. 6B, such that the power and the voltage amplitude on the load line are maximized. In this case, the matching of input/output can be made by constant matching circuits 18i and 18o rather than variable matching circuits.

In the circuit shown in FIG. 6A, the continuous output power adjustment becomes possible, but as shown in FIG. 6B, the slope of the load lines (K1B1 and K2B2) remains unchanged so that the variable matching circuit is basically unnecessary, and the RF output power for realizing the maximum efficiency is lowered by about 6 dB when the power source voltage is simply reduced to ½.

A variable voltage source with sufficiently high efficiency capable of supplying a large amount of currents to be consumed by the power amplifier can be realized by a step-down DC-DC converter as shown in FIG. 6C in which a resistance L and a capacitor C are appropriately connected by switches Q1 and Q2 controlled by a control circuit. However, the lowest output voltage is only about 1 V due to the reference voltage of the internal regulator, and the efficiency of the variable voltage source is degraded at the low voltage output, so that it is difficult to maintain the high efficiency over a wide output power range and there is also a problem that the implementation area is large.

Also, in the communications using the CDMA scheme, for example, there is a need to change the transmission output power according to a distance between a mobile station and a base station. This is because there is a need to align radio signals from a plurality of mobile stations at receiver input terminals of the base station. Similarly, it is preferable to align radio signals arriving from a plurality of base stations at receiver input terminals of the mobile station.

For this reason, the transmission power control is carried out in the communication system using the CDMA scheme, such that the transmission power varies within a range (dynamic range) of about 75 dB. Consequently, the power addition efficiency of the power amplifier is required to be high at the powers other than the maximum output power. The probability density function for the transmission powers is roughly in a form of the normal distribution, and the average transmission power of the mobile terminal is in a range of 10 dBm to 16 dBm, although it varies due to system related factors such as the arrangement of the base stations. Thus, there is a need to maintain a high power addition efficiency throughout a range of about 0 dBm (low output) to 30 dBm (high output).

BRIEF SUMMARY OF THE INVENTION

It is therefore an object of the present invention to provide a high frequency circuit capable of realizing a power amplifier with a wide dynamic range in which it is hard to degrade the power addition efficiency at low output, using a simple circuit requiring a small implementation area, as well as a compact and lightweight communication device that can be realized by using such a high frequency circuit.

According to one aspect of the present invention there is provided a high frequency circuit, comprising: a high output amplifier cell block configured to amplify input signals at a time of high output power, in which a DC power source voltage is supplied in parallel to first amplifier cells that are connected in parallel AC-wise with respect to input/output signals; a low output amplifier cell block configured to amplify the input signals at a time of low output power, in which the DC power source voltage is supplied in series to second amplifier cells that are connected in parallel AC-wise with respect to the input/output signals; a first connection unit configured to connect input sides of the high output amplifier cell block and the low output amplifier cell block with an input terminal from which the input signals are entered; and a second connection unit configured to connect output sides of the high output amplifier cell block and the low output amplifier cell block with an output terminal to which output signals are outputted.

According to another aspect of the present invention there is provided a communication device, comprising: at least one antenna configured to transmit or receive radio signals; at least one power amplifier configured to amplify the radio signals to be transmitted or received by the at least one antenna, including a high frequency circuit formed by: a high output amplifier cell block configured to amplify input signals at a time of high output power, in which a DC power source voltage is supplied in parallel to first amplifier cells that are connected in parallel AC-wise with respect to input/output signals; a low output amplifier cell block configured to amplify the input signals at a time of low output power, in which the DC power source voltage is supplied in series to second amplifier cells that are connected in parallel AC-wise with respect to the input/output signals; a first connection unit configured to connect input sides of the high output amplifier cell block and the low output amplifier cell block with an input terminal from which the input signals are entered; and a second connection unit configured to connect output sides of the high output amplifier cell block and the low output amplifier cell block with an output terminal to which output signals are outputted; and a control unit configured to control the high output amplifier cell block and the low output amplifier cell block by putting either one of the high output amplifier cell block and the low output amplifier cell block in an amplification operation state and another one of the high output amplifier cell block and the low output amplifier cell block in a high impedance state.

Other features and advantages of the present invention will become apparent from the following description taken in conjunction with the accompanying drawings.

BRIEF DESCRIPTION OF THE DRAWINGS

FIGS. 20A and 20B are diagrams showing exemplary configurations of communication devices using a high frequency circuit of the present invention according to the seventh embodiment of the present invention.

DETAILED DESCRIPTION OF THE INVENTION

In the following description, a phrase "amplifier cells connected in parallel AC-wise" will be used to imply that target amplifier cells of nearly identical size are connected at nearly identical phase with nearly identical amplitude. Strictly speaking from a viewpoint of distributed constant circuits, a connection at exactly identical phase with exactly identical amplitude is difficult to realize in practice, so that a phase "amplifier cells connected in parallel AC-wise" can be construed as meaning that the efficiencies of the power distribution at the input side and the power composition at the output side of a plurality of cell blocks, such as cell blocks 4a and 4b, 4c and 4d shown in FIGS. 9A and 9B to be described below or transistors Q1 and Q2 shown in FIGS. 11A and 11B to be described below, are both greater than or equal to 50%, for example. In the case of splitting into N, these efficiencies of the power distribution and the power composition are given given by the following expression:

$$(|S_{1\ T}+S_{2\ T}+S_{2\ T}+\ldots S_{n\ T}|)/(|S_{1\ T}|+|S_{2\ T}|+|S_{2\ T}|+\ldots +|S_{n\ T}|)$$

where $S_{n\ T}$ is an S parameter vector for transmission of a common terminal T of the distribution and composition circuits to an n-th split port.

Also, in the following description, a phrase "DC power source voltage is supplied in parallel" will be used to imply that nearly identical level of voltage is applied to target cells. Strictly speaking, it is practically difficult to apply exactly identical level of voltage because of a voltage dropping due to circuit losses, so that a phrase "DC power source voltage is supplied in parallel" can be construed as meaning that the voltage is applied within a tolerable range of ±20% with respect to a plurality of cell blocks, such as cell blocks 4a to 4c shown in FIGS. 9A and 9B to be described below, or cells that constitute these cell blocks.

Figure 11A:
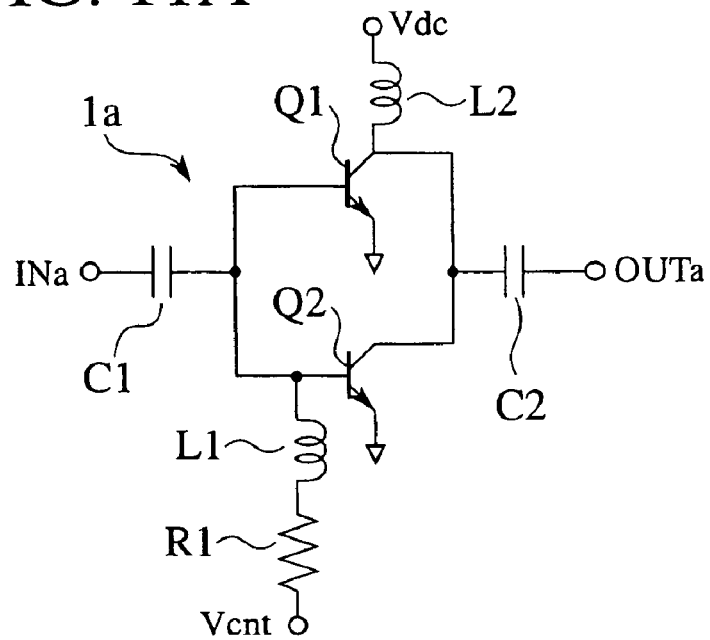
FIGS. 11A and 11B are circuit diagrams respectively showing equivalent circuits of a high output amplifier cell block and a low output amplifier cell block in the power amplifier of FIG. 7.
Figure 11B:
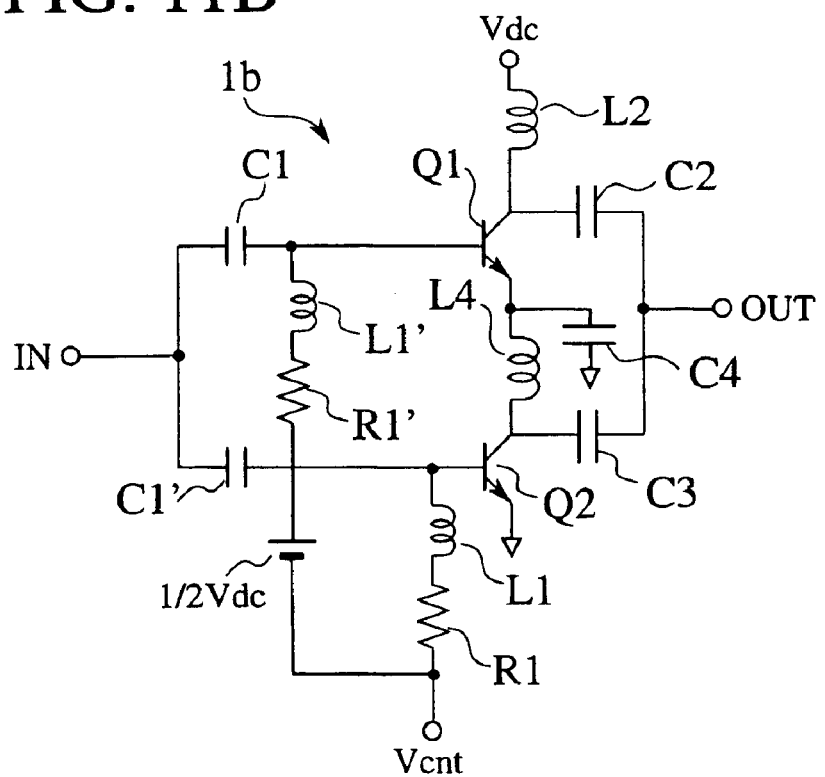

Also, in the following description, a phrase "DC power source voltage is supplied in series" will be used to imply that, when the "amplifier cells connected in parallel AC-wise" are transistor cells Q1 and Q2 as shown in FIG. 11B to be described below, the voltage given at a collector of the transistor cell Q1 is applied to these plurality of transistor cells in division, in such a way that the DC flows from a collector of the transistor cell Q1 through an emitter to a collector of the transistor cell Q2 and is then grounded, for example. In this example, the case of the emitter grounding in the bipolar transistor is described, but the above phrase should be construed as meaning that the voltage is applied to a plurality of transistors in division, even in the case of using field effect transistors or different grounding forms.

Also, in the following description, a term "transistor cell" will be used to indicate a set of transistors having nearly identical characteristics. Strictly speaking from a viewpoint of the device process, it is practically difficult to fabricate transistors with exactly identical characteristics. Even if geometrically similar transistors are used, they may not operate as identical transistors depending on their layout positions on a semiconductor chip or differences in their surrounding electromagnetic and thermal environments due to a substrate on which the semiconductor chip is implemented, etc. Also, even within a semiconductor wafer, geometrically similar transistors may not necessary have identical characteristics, due to the non-uniformity of characteristics which is a well known problem associated with transistors in general.

Note that a set of transistors are formed by bundling a plurality of tiny unit transistors (in units of gate in the case of FETs, in units of emitter or base in the case of bipolar transistors, for example) that are physically independent in the power amplifier. If a sufficient power cannot be obtained in this state, an even larger transistor is formed by bundling these transistors. As such, a transistor used in the power amplifier is a set of a plurality of tiny transistors in general.

[First Embodiment]
(Overall Configuration)

Now, the first embodiment of a high frequency circuit according to the present invention will be described in detail with references to the drawings.

Figure 7:
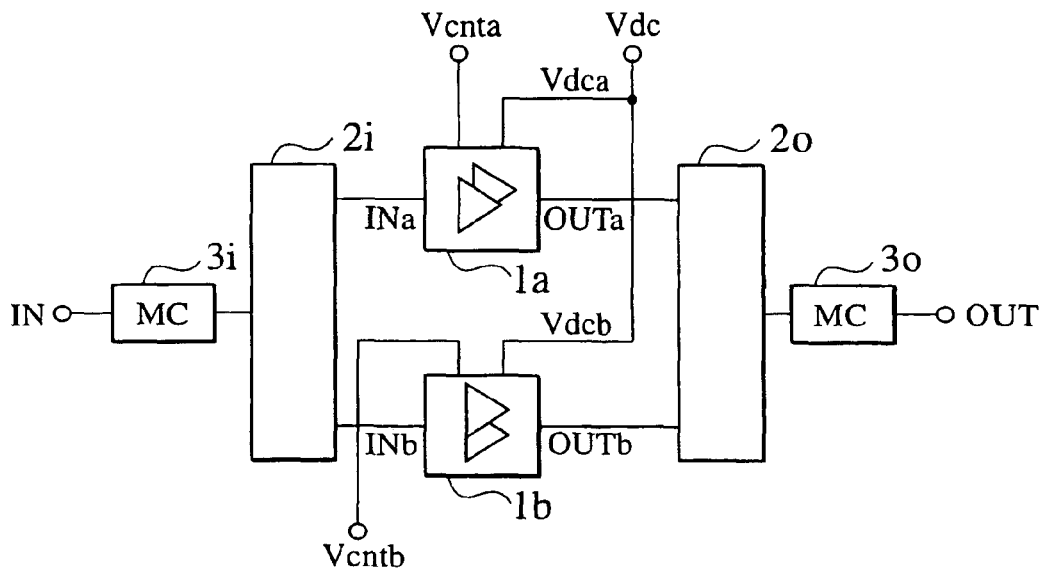
FIG. 7 is a block diagram showing a configuration of a power amplifier using a high frequency circuit according to the first embodiment of the present invention.

FIG. 7 shows an exemplary configuration of a power amplifier formed by using a high frequency circuit of this embodiment.

As shown in FIG. 1, the power amplifier according to this embodiment comprises an input matching circuit 3$i$, a first connection unit 2$i$ for splitting signals entered from the input matching circuit 3$i$, a high output amplifier cell block 1$a$, a low output amplifier cell block 1$b$, a second connection unit 2$o$ to which signals from the high output amplifier cell block 1$a$ and the low output amplifier cell block 1$b$ are entered, and an output matching circuit 3$o$.

The high output amplifier cell block 1$a$ has amplifier cells which are connected in parallel AC-wise with respect to input and output signals, and DC power source voltage is supplied in parallel to these amplifier cells. On the other hand, the low output amplifier cell block 1$b$ has amplifier cells that are connected in parallel AC-wise with respect to input and output signals, and DC power source voltage is supplied in series to these amplifier cells.

The high output amplifier cell block 1$a$ has a signal input terminal INa, a signal output terminal OUTa, a power source voltage terminal Vdca, and a control voltage terminal Vcnta, and the low output amplifier cell block 1$b$ has a signal input terminal INb, a signal output terminal OUTb, a power source voltage terminal Vdcb, and a control voltage terminal Vcntb.

Figure 8:
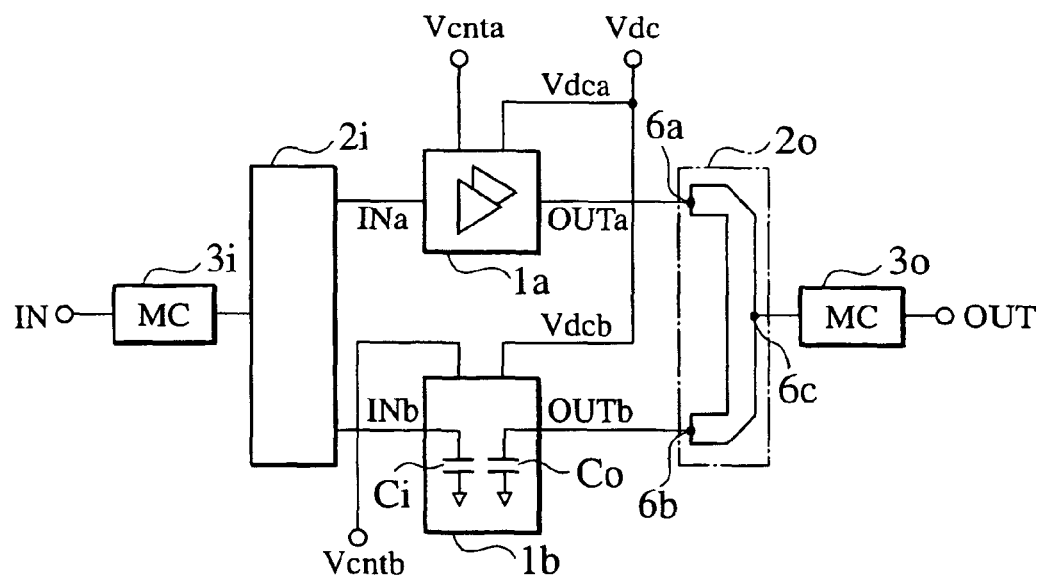
FIG. 8 is a block diagram showing an operation state of the power amplifier of FIG. 7.

In this embodiment, each one of the first and second connection units 2$i$ and 2$o$ is formed by using only passive elements such as coils and capacitors, so as to provide a splitting circuit formed by transmission paths, for example, as indicated in the second connection unit 2$o$ shown in FIG. 8. Namely, the use of active elements for switching signal paths such as switches used in the conventional circuits of FIGS. 4A, 5A, 5B and 5C in addition to active elements for amplifying RF signals can cause the complication of a circuit configuration, the increase of the required number of parts, the increase of the implementation area, and the degradation of signals due to distortion or loss, which can lead to the higher cost and the lower performance. For this reason, the use of such active elements is avoided in this embodiment and the first and second connection units 2$i$ and 2$o$ are formed by using only passive elements in order to achieve the equivalent or better effects by a simpler configuration.

(Configuration of Amplifier Cell Blocks)

Next, the configurations of the high output amplifier cell block 1$a$ and the low output amplifier cell block 1$b$ will be described.

Figure 9A:
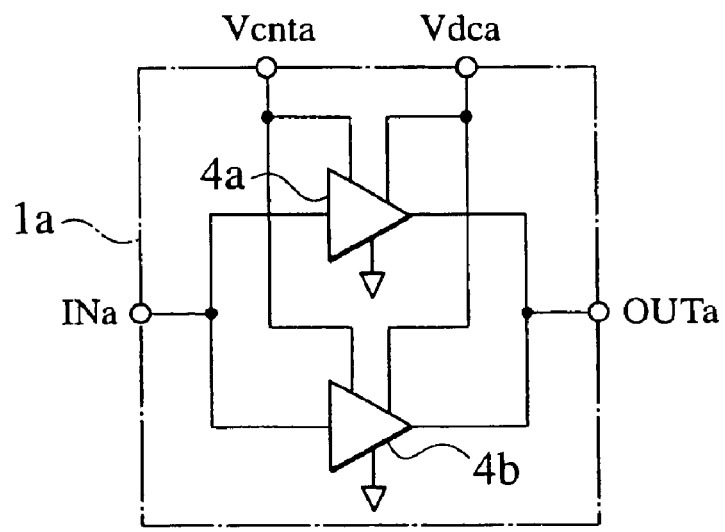
FIGS. 9A and 9B are diagrams respectively showing internal configurations of a high output amplifier cell block and a low output amplifier cell block in the power amplifier of FIG. 7.
Figure 9B:
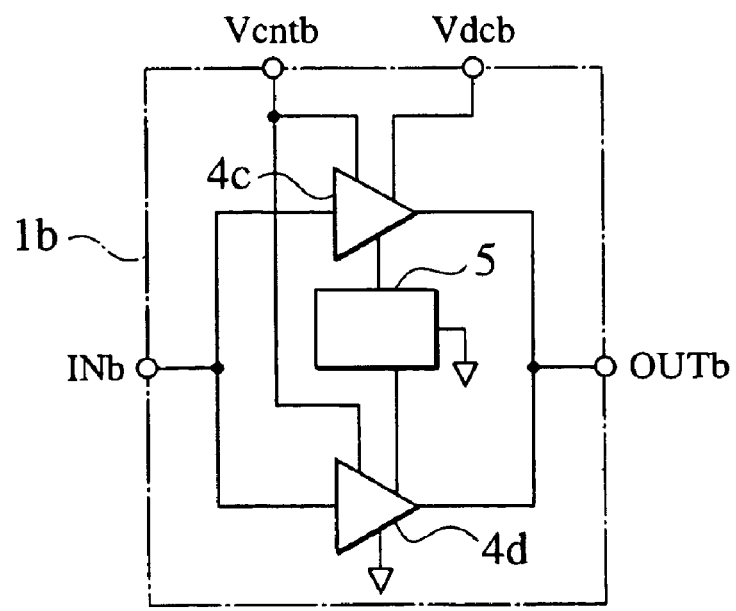

FIG. 9A and FIG. 9B show exemplary internal configurations of the high output amplifier cell block 1$a$ and the low output amplifier cell block 1$b$ respectively. Note that amplifier cells 4$a$, 4$b$, 4$c$ and 4$d$ used in this embodiment are formed by transistors of the same size.

As shown in FIG. 9A, the high output amplifier cell block 1$a$ of this embodiment has two amplifier cells 4$a$ and 4$b$, and these amplifier cells 4$a$ and 4$b$ are connected in parallel with respect to the input and output signals, and also connected in parallel with respect to the DC power source voltage Vdca. In addition, the control voltage Vcnta is also given in parallel to the amplifier cells 4$a$ and 4$b$.

As shown in FIG. 9B, the low output amplifier cell block 1$b$ of this embodiment has two amplifier cells 4$c$ and 4$d$, and these amplifier cells 4$c$ and 4$d$ are connected in parallel with respect to the input and output signals, and also connected in series with respect to the DC power source voltage Vdcb. In addition, the control voltage Vcntb is also given in parallel to the amplifier cells 4$c$ and 4$d$.

The amplifier cells 4$c$ and 4$d$ in the low output amplifier cell block 1$b$ are connected by an AC/DC separation unit 5 such as bias T, for example, and this AC/DC separation unit 5 realizes a grounding of AC of the amplifier cell 4$c$, while DC is applied to the DC power source terminal of the amplifier cell 4$d$. As a result, the DC power source voltage applied to the amplifier cells 4$c$ and 4$d$ is divided into two equal parts, i.e., ½ each.

In this embodiment, the number of the amplifier cells 4$a$ and 4$b$ in the high output amplifier cell block 1$a$ is set equal to the number of the amplifier cells 4$c$ and 4$d$ in the low output amplifier cell block 1$b$, so that the input and output impedances are equal ideally speaking. Consequently, the slopes of the load lines can be made identical by using the common input and output matching circuits 3$i$ and 3$o$. In this case, for the high output amplifier cell block 1$a$ and the low output amplifier cell block 1$b$, the power source voltage is ½ and the load line is identical so that the maximum current also becomes ½ and the maximum output power can be reduced to ¼ (−6 dB).

Figure 6A:
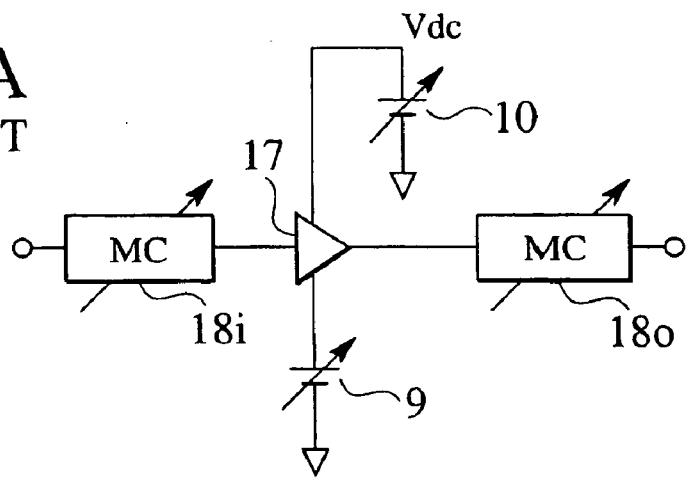
FIGS. 6A and 6B are a connection diagram and a graph showing a relationship between current and voltage for explaining another exemplary conventional amplifier circuit.
Figure 6B:
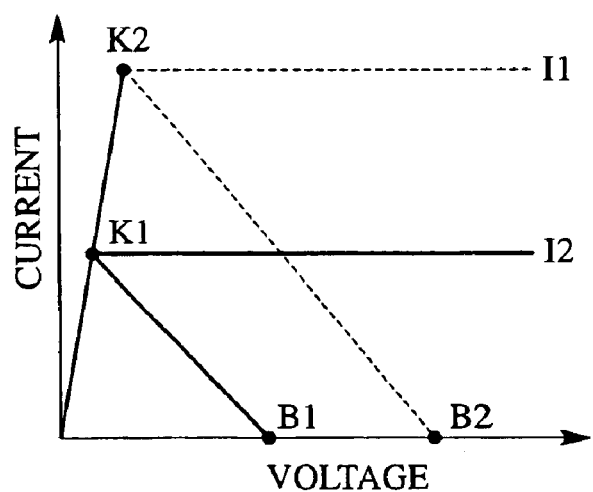
Figure 6C:
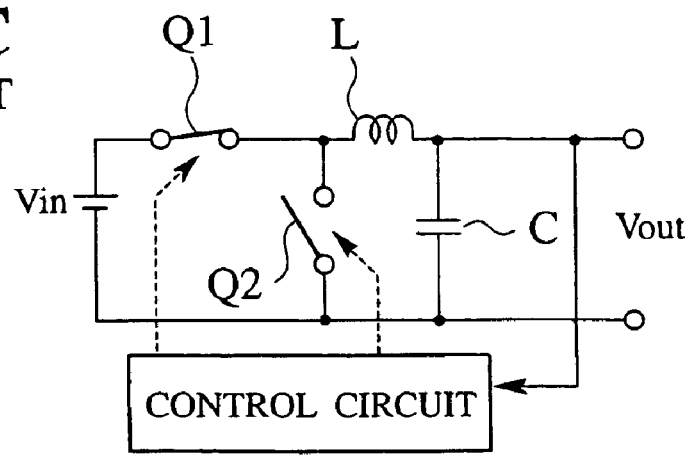
FIG. 6C is a diagram showing an exemplary circuit that can be used as a variable voltage source in the conventional amplifier circuit of FIG. 6A.

This embodiment is equivalent to a state in which the bias voltage B1 becomes ½ of the bias voltage B2 in FIG. 6B. For example, in the case of forming a power amplifier with the maximum output power of 30 dBm, if the maximum output power of the high output amplifier cell block 1$a$ is set to 30 dBm, the maximum output power of the low output amplifier cell block 1$b$ can be about 24 dBm because the power source voltage is ½.

For the output power greater than or equal to 24 dBm, the high output amplifier cell block 1$a$ is put in an operation state while the low output amplifier cell block 1$b$ is put in a non-operation state.

Figure 1A:
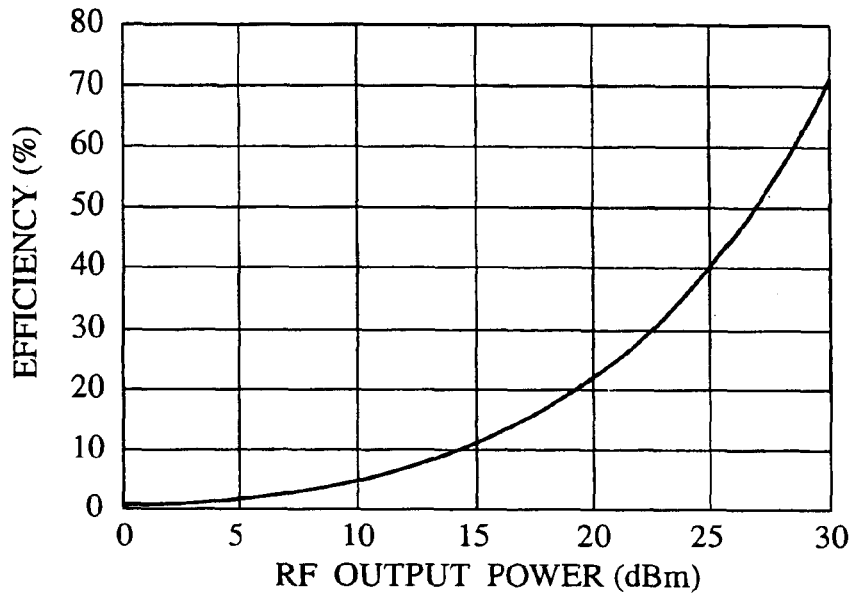
FIGS. 1A and 1B are graphs showing a relationship between the RF output power and the efficiency in a conventional power amplifier.
Figure 1B:
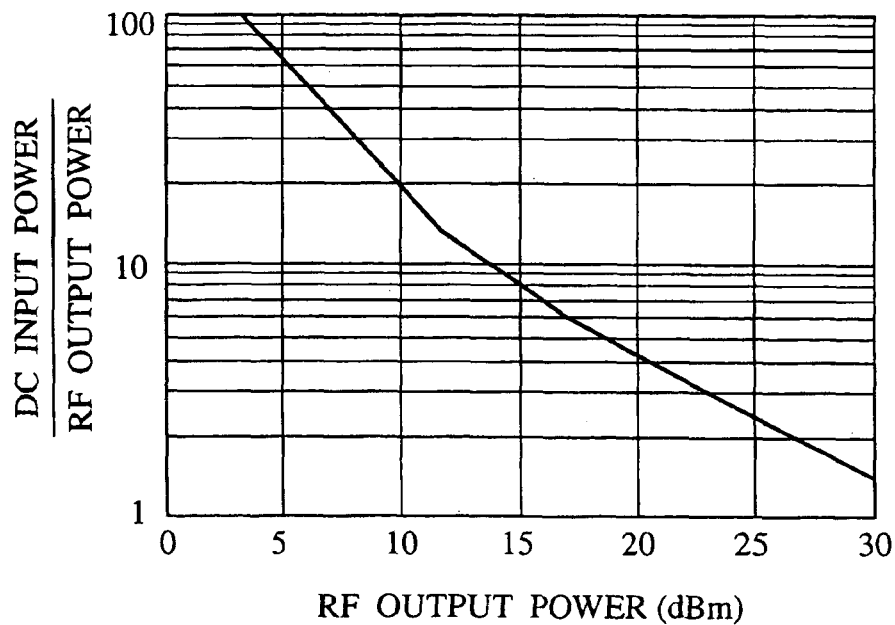
Figure 2A:
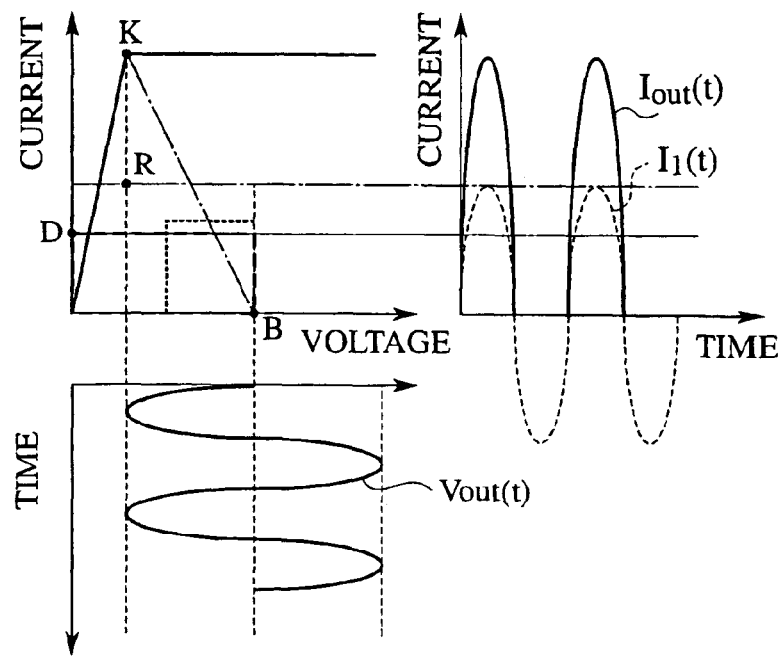
FIGS. 2A and 2B are diagrams for explaining a lowering of the efficiency at low output in a conventional power amplifier.
Figure 2B:
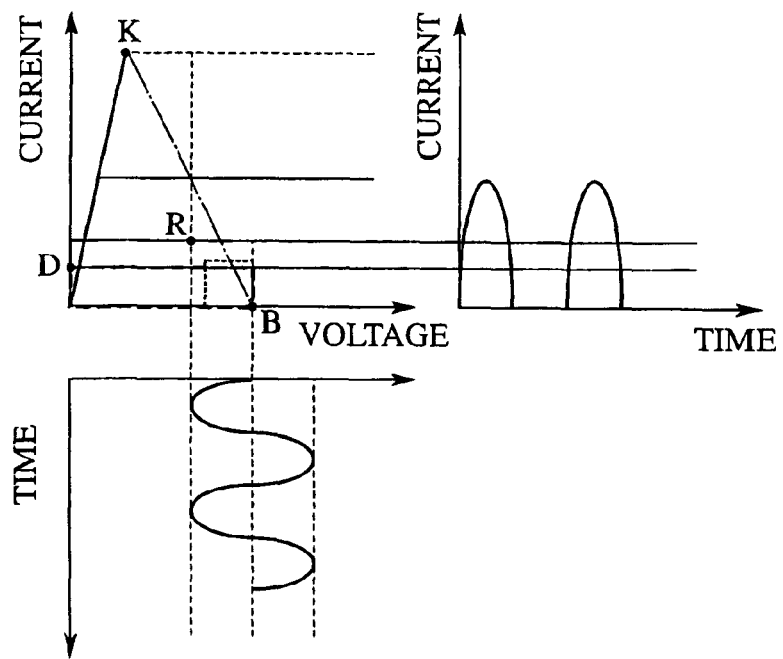
Figure 3A:
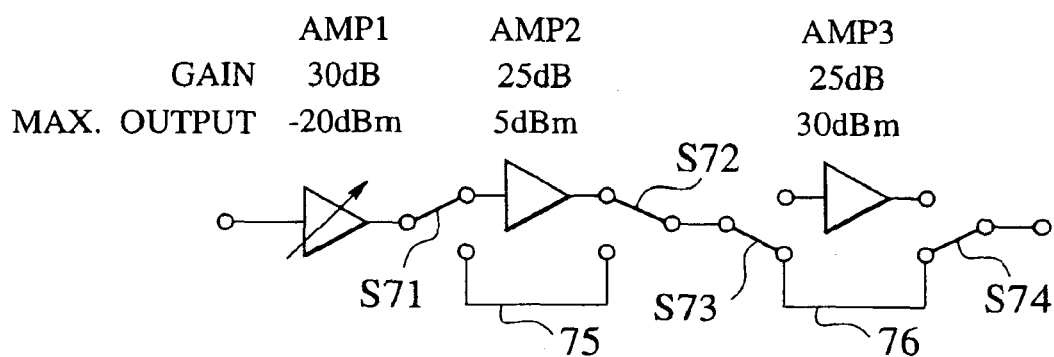
FIGS. 3A and 3B are a connection diagram and a gain diagram for explaining one exemplary conventional amplifier circuit.
Figure 3B:
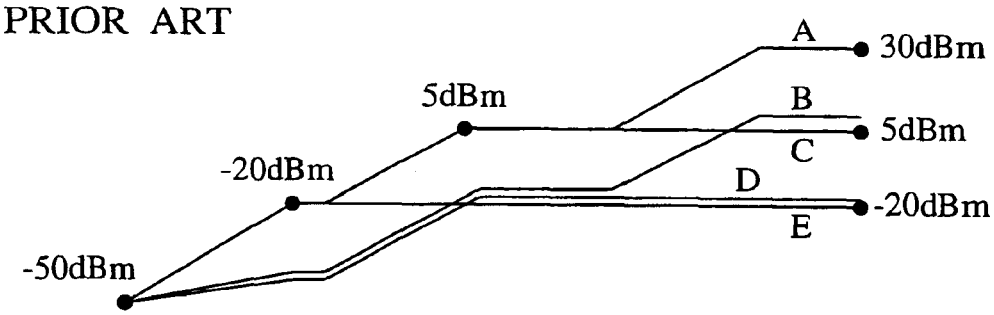
Figure 4A:
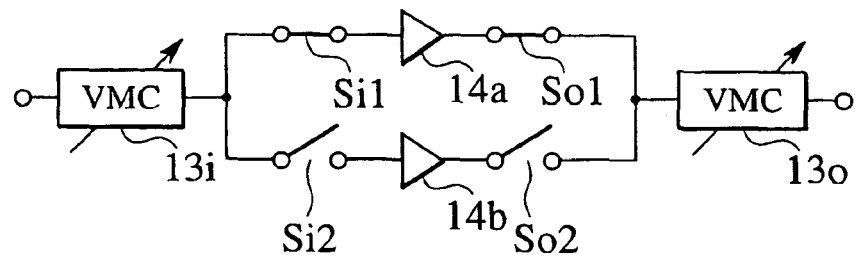
FIGS. 4A and 4B are a connection diagram and a graph showing a relationship between current and voltage for explaining another exemplary conventional amplifier circuit.
Figure 4B:
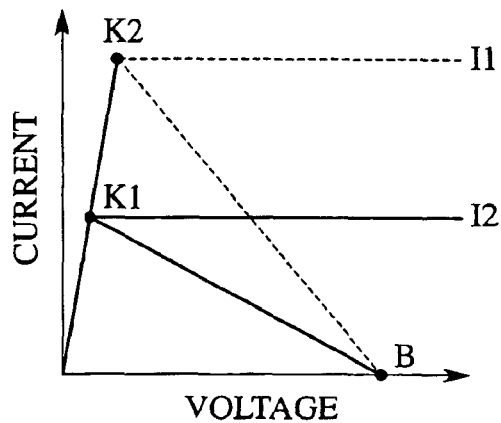
Figure 5A:
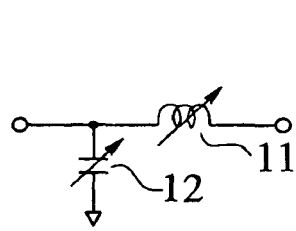
FIGS. 5A, 5B and 5C are diagrams showing exemplary circuits that can be used as a variable matching circuit in the conventional amplifier circuit of FIG. 4A.
Figure 5B:
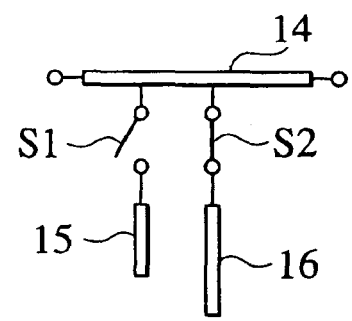
Figure 5C:
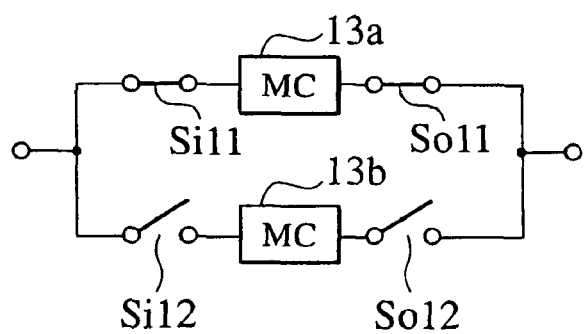
Figure 10:
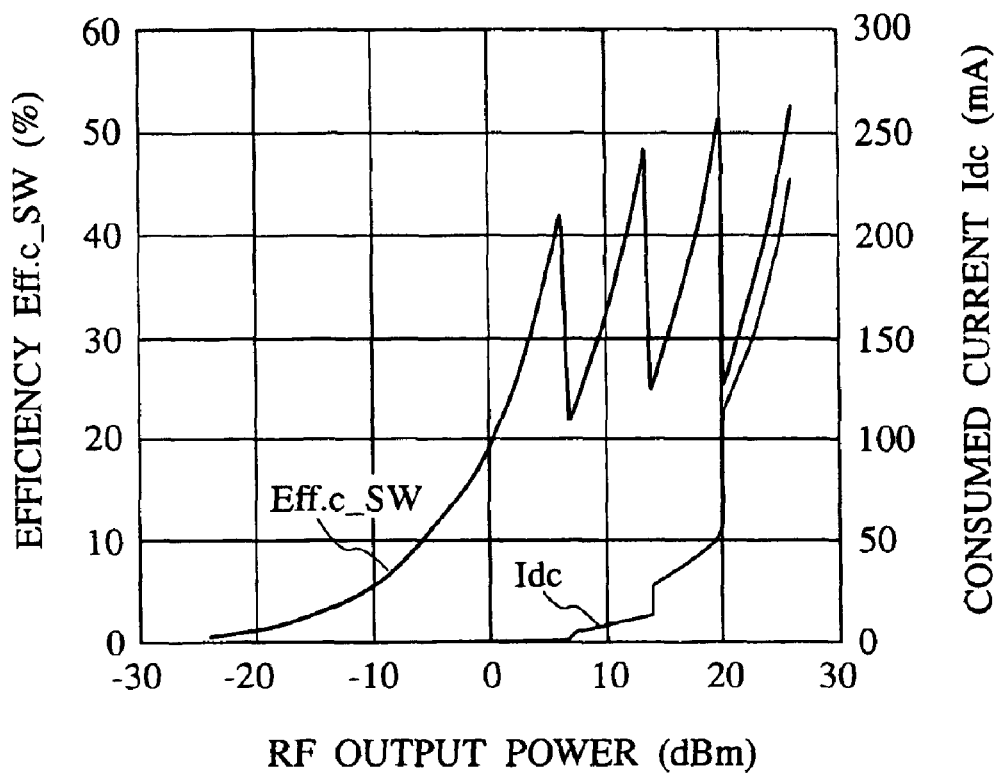
FIG. 10 is a graph showing a relationship between the output power and the efficiency in the power amplifier of FIG. 7.

As already described with references to FIGS. 1A and 1B, the efficiency will be lowered as the output power becomes lower than the maximum output power 30 dBm. When the output power is about 24 dBm which is the maximum output power of the low output amplifier cell block 1$b$, the efficiency is lowered to 35.4%. At this point, the high output amplifier cell block 1$a$ is put in a non-operation state while the low output amplifier block 1$b$ is put in an operation state, such that the efficiency is recovered to 72% again, and them lowered to 35% again as the output power is lowered further. In this way, by providing a plurality of amplifier cell blocks, the efficiency can be recovered to about 72% even at the low output, so that a relationship between the efficiency and the output power becomes a saw-tooth shaped line with about 6 dB interval between adjacent peaks as shown in FIG. 10.

FIGS. 11A and 11B show equivalent circuits of the high output amplifier cell block 1a and the low output amplifier cell block 1b shown in FIGS. 9A and 9B respectively.

In FIGS. 11A and 11B, C1, C1' and C2 are DC preventing capacitors, L1, L1' and L2 are RF chokes, R1 and R1' are stabilizing resistors, and Q1 and Q2 are bipolar transistors. Note that the same effects can also be realized by using field effect transistors for Q1 and Q2.

Also in FIG. 11B, C3 is a DC preventing capacitor for separating collectors of Q1 and Q2 DC-wise, and C4 and L4 forms a filter which functions as the AC/DC separation unit 5 in this embodiment. Namely, C4 realizes the AC-wise grounding in the signal frequency of Q1.

(Operation and Effect)

The power amplifier according to this embodiment in a configuration as described above operates as follows.

First, signals entered from an input terminal IN are entered into the high output amplifier cell block 1a and the low output amplifier cell block 1b through the input matching circuit 3i and the first connection unit 2i. The output signals of the high output amplifier cell block 1a and the low output amplifier cell block 1b are outputted from an output terminal OUT through the second connection unit 2o and the output matching circuit 3o.

Here, in the high frequency circuit according to this embodiment, one of the amplifier cell blocks 1a and 1b is selected according to the power to be outputted, and these amplifier cell blocks 1a and 1b are switched between an amplification operation state and a non-operation state with high impedance, by the control voltages Vcnta and Vcntb. Only one amplifier cell block is put in the amplification operation state at any given moment. For example, as shown in FIG. 8, when the high output amplifier cell block 1a is put in the amplification operation state, the low output amplifier cell block 1b is put in a high impedance non-operation state.

The input and output impedances of the low output amplifier cell block 1b in the high impedance non-operation state can be expressed as capacitances Ci and Co respectively. The resistance component that is entered into open capacitances is ignored here as it only causes a negligible loss compared with the output impedance of the high output cell block 1a. The load impedance from a viewpoint of an output node 6a of the high output amplifier cell block 1a is that of a parallel connection of the output matching circuit 3o and a stab with the open capacitance Co beyond a splitting point node 6c. Here, there is a need to select a distance between nodes 6a and 6c and a distance between nodes 6b and 6c such that the impedance of the stab with the open capacitance Co does not satisfy a short circuit condition. By setting the non-operating transistor in the high impedance state, the operating amplifier cell block can be selected without using any switch.

[Second Embodiment]

Next, the second embodiment of the present invention will be described in detail.

The first embodiment described above is directed to the case of using two amplifier cell blocks as shown in FIG. 7, but the present invention is not limited to this specific case.

For example, the number of steps connected in series with respect to DC in the low output amplifier cell block is two in the first embodiment, but this number can be increased to four, eight, and so on. In the case of four steps, for example, the three types of amplifier cell blocks using one step, two steps, and four steps may be used, or two types of amplifier cell blocks using one step and four steps may be used. Similarly, in the case of eight steps, four types of amplifier cell blocks using one step, two steps, four steps and eight steps may be used, or any three types out of these four types may be used, or any two types out of these four types may be used. It should be apparent that the circuit configuration becomes more complicated when the number of steps is increased. The number of steps to be used should be selected by taking the effect at a time of the power control into consideration.

Note that the number of steps need not takes a form of $2^n$, but it is assumed to be in a form of $2^n$ here. When the largest number of steps is $N=2^n$, up to n+1 types of the amplifier cell blocks using the respective number of steps equal to 1, 2, 4, . . . , $2^n$ can be used. The choice of the types of the amplifier cell blocks to be used in combination is arbitrary as described above, but it should be noted that the use of the same number of steps in different amplifier cell blocks would result in a poor circuit efficiency.

Now, the exemplary case of n=2 and using three amplifier cell blocks will be described with reference to FIG. 12. In this example, the dynamic range greater than or equal to 12 dB can be realized.

Figure 12:
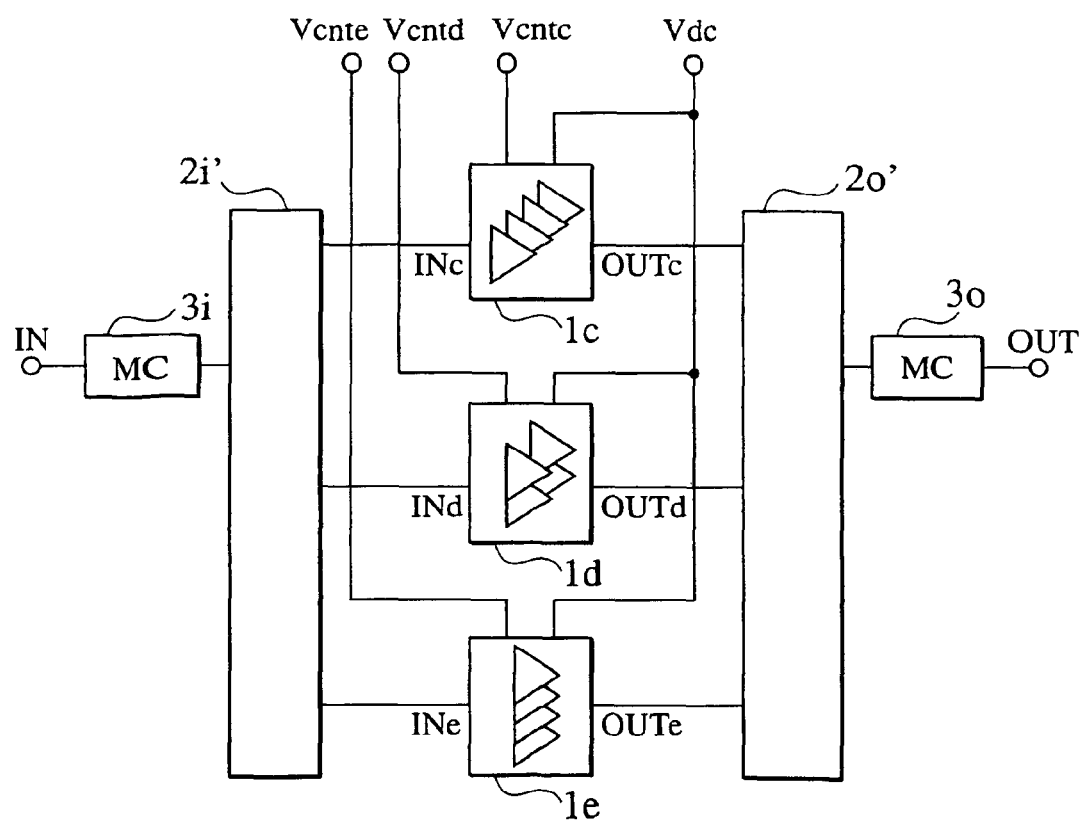
FIG. 12 is a block diagram showing a configuration of a power amplifier using a high frequency circuit according to the second embodiment of the present invention.

As shown in FIG. 12, the power amplifier according to this embodiment comprises an input matching circuit 3i, a first connection unit 2i for splitting signals entered from the input matching circuit 3i, a high output amplifier cell block 1c, a middle output amplifier cell block 1d, a low output amplifier cell block 1e, a second connection unit 2o to which signals from the high output amplifier cell block 1c, the middle output amplifier cell block 1d and the low output amplifier cell block 1e are entered, and an output matching circuit 3o.

Figure 13A:
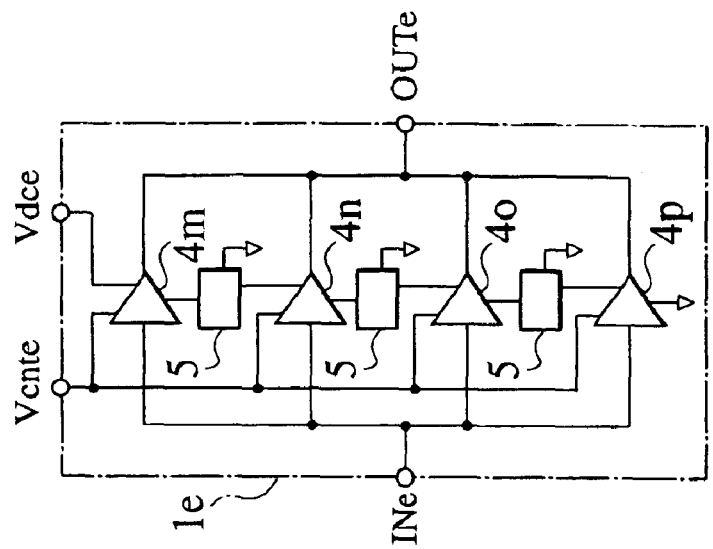
FIGS. 13A, 13B and 13C are diagrams respectively showing internal configurations of a high output amplifier cell block, a middle output amplifier cell block and a low output amplifier cell block in the power amplifier of FIG. 12.

In further detail, as shown in FIG. 13A, the high output amplifier cell block 1c of this embodiment has four amplifier cells 4e to 4h, and these amplifier cells 4e to 4h are connected in parallel with respect to the input and output signals, and also connected in parallel with respect to the DC power source voltage Vdcc. In addition, the control voltage Vcntc is also given in parallel to the amplifier cells 4e to 4h.

Figure 13B:
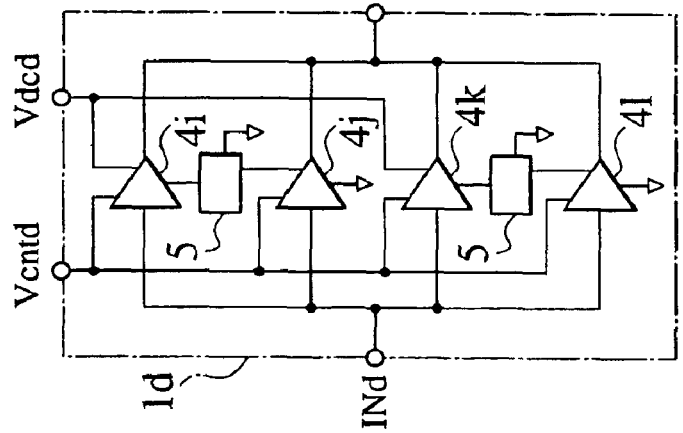

Also, as shown in FIG. 13B, the middle output amplifier cell block 1d of this embodiment has two amplifier cells 4i and 4l, and these amplifier cells 4i to 4l are connected in parallel with respect to the input and output signals. Also, a pair of the amplifier cells 4i and 4j and a pair of the amplifier cells 4k and 4l are connected in series with respect to the DC power source voltage Vdcd while the first stage amplifier cells 4i and 4k of these pairs are connected in parallel. In addition, the control voltage Vcntd is also given in parallel to the amplifier cells 4i and 4l.

Each pair of the amplifier cells 4i and 4j, or 4k and 4l, in the middle output amplifier cell block 1d are connected by an AC/DC separation unit 5 such as bias T, for example, and this AC/DC separation unit 5 realizes a grounding of AC of the amplifier cells 4i and 4k, while DC is applied to the DC power source terminals of the second stage amplifier cells 4j and 4l. As a result, the DC power source voltage applied to the amplifier cells 4i to 4l is divided into two equal parts, i.e., ½ each.

Figure 13C:
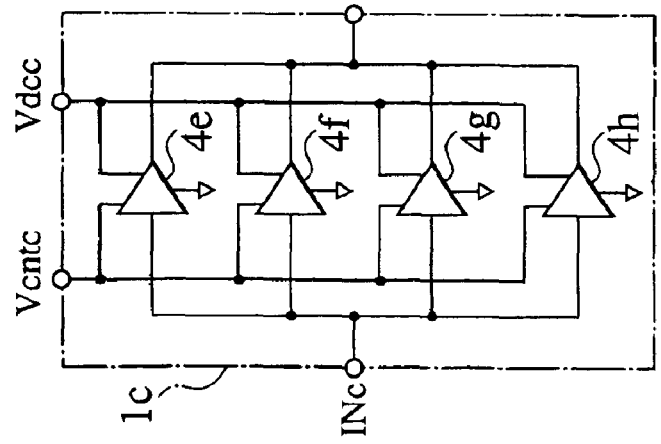

Also, as shown in FIG. 13C, the low output amplifier cell block 1e of this embodiment has four amplifier cells 4m to 4p, and these amplifier cells 4m to 4p are connected in parallel with respect to the input and output signals, and also connected in series with respect to the DC power source voltage Vdce. In addition, the control voltage Vcnte is also given in parallel to the amplifier cells 4m to 4p.

The amplifier cells 4m to 4p in the low output amplifier cell block 1e are connected by an AC/DC separation unit 5 such as bias T, for example, and this AC/DC separation unit 5 realizes a grounding of AC of the amplifier cell 4m to 4o, while DC is applied to the DC power source terminal of the amplifier cell 4n to 4p. As a result, the DC power source voltage applied to the amplifier cells 4m to 4p is divided into four equal parts, i.e., ¼ each.

In the power amplifier according to this embodiment, by connecting three amplifier cell blocks 1c, 1d and 1e, it becomes possible to realize a wider dynamic range compared with the first embodiment described above. Note that the dynamic range can be widened easily by increasing the number of steps to be connected in series with respect to DC in the amplifier cell block further. For example, the dynamic range greater than or equal to 18 dB can be realized by using four amplifier cell blocks where each amplifier cell block is formed by eight divided amplifier cells and a division of the DC power source voltage in eight steps (⅛) at most.

[Third Embodiment]

Next, the third embodiment of the present invention will be described in detail.

In the first embodiment described above, as shown in FIGS. 11A and 11B, the DC power source voltage Vdc is entered through L2 and the flow of DC to the output terminal is prevented by the DC preventing capacitor C2. In this embodiment, as shown in FIG. 14, the DC power source voltage Vdc is given from a node 6c side by using a circuit through which DC can flow as the second connection unit 2o.

Figure 14:
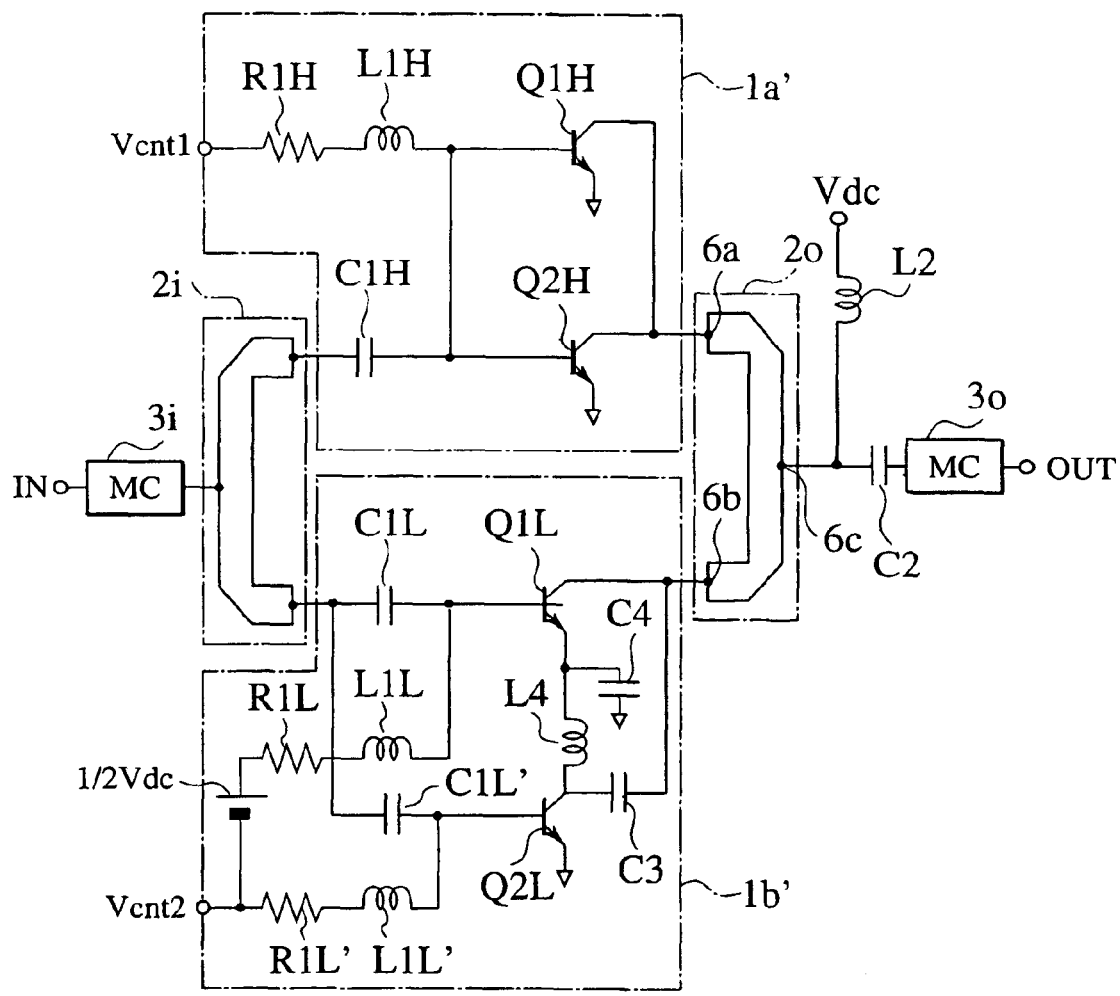
FIG. 14 is a block diagram showing a configuration of a power amplifier using a high frequency circuit according to the third embodiment of the present invention.

More specifically, as shown in FIG. 14, the high output amplifier cell block 1a' of this embodiment has a structure in which the signals entered from the first connection unit 2i are entered into the bipolar transistors Q1H and Q2H in parallel through the DC preventing capacitor C1H while the control voltage Vcnt1 is entered into the bipolar transistors Q1H and Q2H in parallel through the stabilizing resistor R1H and the RF choke L1H. Vdc is entered into the bipolar transistors Q1H and Q2H in parallel from the second connection unit 2O side through L2.

On the other hand, the low output amplifier cell block 1b' of this embodiment has a structure in which the signals entered from the first connection unit 2i are entered into the bipolar transistors Q1L and Q2L in parallel through the DC preventing capacitor C1L while the control voltage Vcnt2 is entered into the bipolar transistors Q1L and Q2L in parallel through the stabilizing resistor R1L and the RF choke L1L.

In this low output amplifier cell block 1b', Vdc is entered into the bipolar transistors Q1L and Q2L in series DC-wise from the second connection unit 20 side through L2. Namely, using the DC preventing capacitor C3 and the RF choke L4, only DC is allowed to flow from the bipolar transistor Q1L to the bipolar transistor Q2L. Also, the grounding of AC is realized by the decoupling capacitor C4.

Then, as shown in FIG. 14, C2 and L2 are removed from the high output amplifier cell block 1a shown in FIG. 11A and the low output amplifier cell block 1b shown in FIG. 11B, and the DC power source voltage is applied at a common power source voltage terminal Vdc through L2 from the node 6c of the second connection unit 2o. Note that C2 shown in FIG. 14 is a DC cut for the output matching circuit 3o.

According to this third embodiment, the DC power source voltage Vdc is supplied from the node 6c side so that L2 and C2 shown in FIGS. 11A and 11B in the first embodiment described above become unnecessary, and it is possible to reduce the circuit area.

Note that, as a modification of this embodiment, it is also possible to supply the DC power source voltage from an open stab within the output matching circuit 3o, for example, instead of placing L2 and C2 at positions as shown in FIG. 14.

[Fourth Embodiment]

Next, the fourth embodiment of the present invention will be described in detail.

In the power amplifier of the first to third embodiments described above, there can be a problem that the number of control signals Vcnt increases when the number of amplifier cell blocks is increased. This problem can be resolved in this embodiment as follows.

Figure 15:
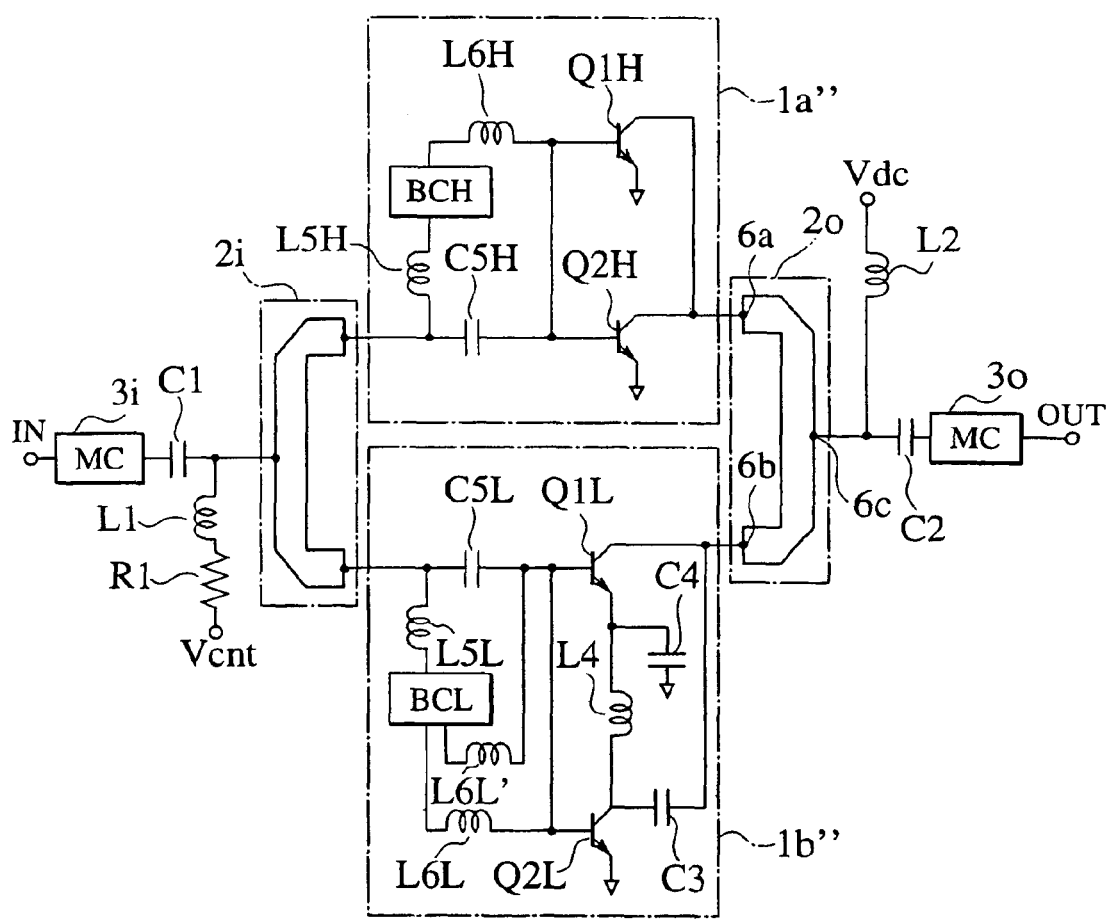
FIG. 15 is a block diagram showing a configuration of a power amplifier using a high frequency circuit according to the fourth embodiment of the present invention.

Using a method similar to the third embodiment described above, two control lines Vcnt1 and Vcnt2 can be commonly supplied from the first connection unit 2i side. FIG. 15 shows an exemplary configuration in this case.

More specifically, as shown in FIG. 15, the high output amplifier cell block 1a" of this embodiment has a structure in which the signals entered from the first connection unit 2i are entered into the bipolar transistors Q1H and Q2H in parallel through the DC preventing capacitor C5H while the control voltage Vcnt is entered into a bias circuit BCH also from the first connection unit 2i side. This bias circuit BCH generates the control signal Vcnt1 according to the control voltage Vcnt, and Vcnt1 generated by this bias circuit BCH is entered into the bipolar transistors Q1H and Q2H in parallel. Vdc is entered into the bipolar transistors Q1H and Q2H in parallel from the second connection unit 2o side by the configuration similar to that of the third embodiment.

On the other hand, the low output amplifier cell block 1b" of this embodiment has a structure in which the signals entered from the first connection unit 2i are entered into the bipolar transistors Q1L and Q2L in parallel through the DC preventing capacitor C5L while the control voltage Vcnt is entered into a bias circuit BCL also from the first connection unit 2i side. This bias circuit BCL generates the control signal Vcnt2 according to the control voltage Vcnt, and Vcnt2 generated by this bias circuit BCL is entered into the bipolar transistors Q1L and Q2L in parallel.

In this low output amplifier cell block 1b", Vdc is entered into the bipolar transistors Q1L and Q2L in series DC-wise from the second connection unit 2o side. Namely, using the DC preventing capacitor C3 and the RF choke L4, only DC is allowed to flow from the bipolar transistor Q1L to the bipolar transistor Q2L. Also, the grounding of AC is realized by the decoupling capacitor C4.

Then, in the power amplifier of this embodiment, control signals Vcnt1 and Vcnt2 are generated according to the common control voltage Vcnt by the bias circuits BCH and BCL respectively. The control signal Vcnt1 generated by the bias circuit BCH is supplied to the transistors Q1H and Q2H through a high frequency choke inductor L6H, and the control signal Vcnt2 generated by the bias circuit BCL is supplied to the transistors Q1L and Q2L through a high frequency choke inductor L6L.

According to the power amplifier of this embodiment, the common control voltage Vcnt is used for the amplifier cell blocks so that even when the number of the amplifier cell blocks is increased, the amount of wirings for the control signals can be reduced and it is possible to reduce the circuit size.

Note that it is also possible to reduce the number of control lines by binarizing or n-arizing a plurality of control signals and generate the control signals by decoding the binarized or n-arized control signals at a bias circuit of each amplifier cell block.

[Fifth Embodiment]

Next, the fifth embodiment of the present invention will be described in detail. FIGS. 16A, 16B, 17A, 17B, 17C, 18A and 18B show various configuration s of the power amplifier according to the fifth embodiment.

Figure 16A:
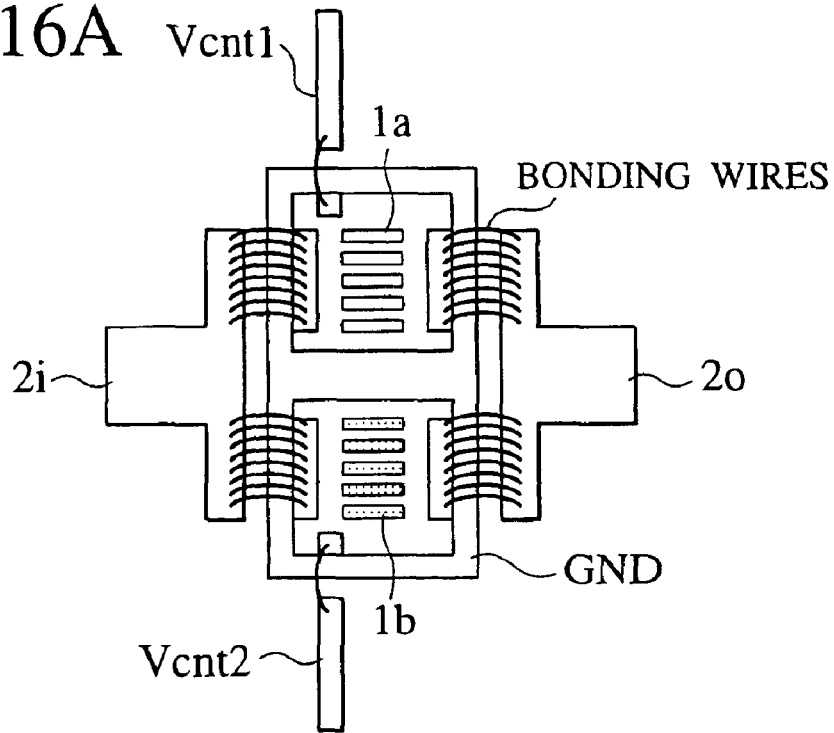
FIGS. 16A and 16B are diagrams showing exemplary configurations of a power amplifier using a high frequency circuit according to the fifth embodiment of the present invention.

In the power amplifier of the firth to fourth embodiments described above, the amplifier cell blocks can be mounted on separate semiconductor chips as shown in FIG. 16A. Namely, the high output amplifier cell block 1a and the low output amplifier cell block 1b can be formed by independent semiconductor chips and mounted on a substrate GND. In this case, the amplifier cell blocks are connected with the first and second connection units 2i and 2o by bonding wires, and the control voltages Vcnt1 and Vcnt2 are also entered from an external of the substrate GND by bonding wires.

Figure 16B:
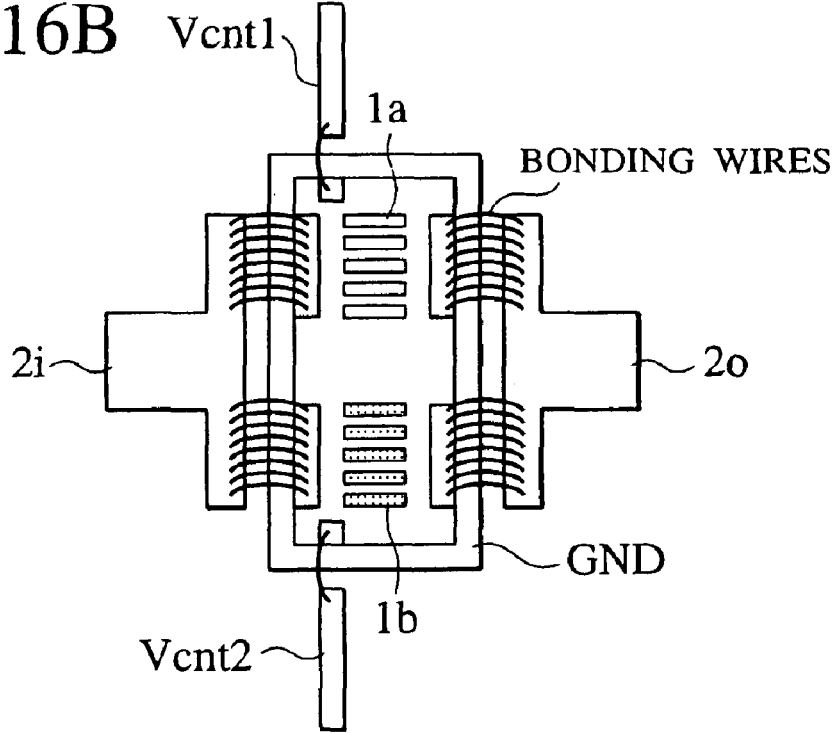

It is also possible to mount a plurality of amplifier cell blocks on an identical semiconductor chip as shown in FIG. 16B. Namely, the high output amplifier cell block 1a and the low output amplifier cell block 1b are formed by an identical semiconductor chip and mounted on the substrate GND. In this case, the amplifier cell blocks are connected with the first and second connection units 2i and 2o by bonding wires, and the control voltages Vcnt1 and Vcnt2 are also entered from an external of the substrate GND by bonding wires. In this case of mounting on an identical chip, a ground electrode can be formed wide so that the ground inductance can be reduced.

In addition, in the case of mounting a plurality of amplifier cell blocks on an identical semiconductor chip, it is also possible to incorporate a part of the T splitting of the first and second connection units 2i and 2o into the chip.

Figure 17A:
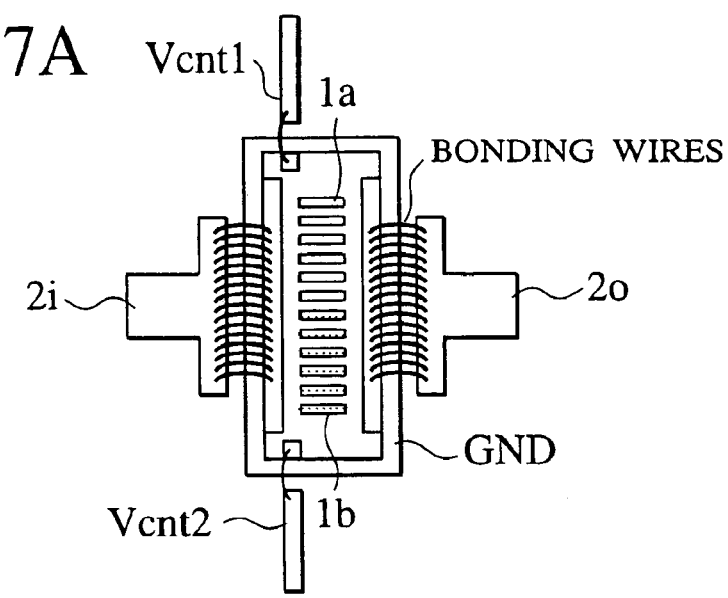
FIGS. 17A, 17B and 17C are diagrams showing exemplary configurations of a power amplifier using a high frequency circuit according to the fifth embodiment of the present invention.
Figure 17B:
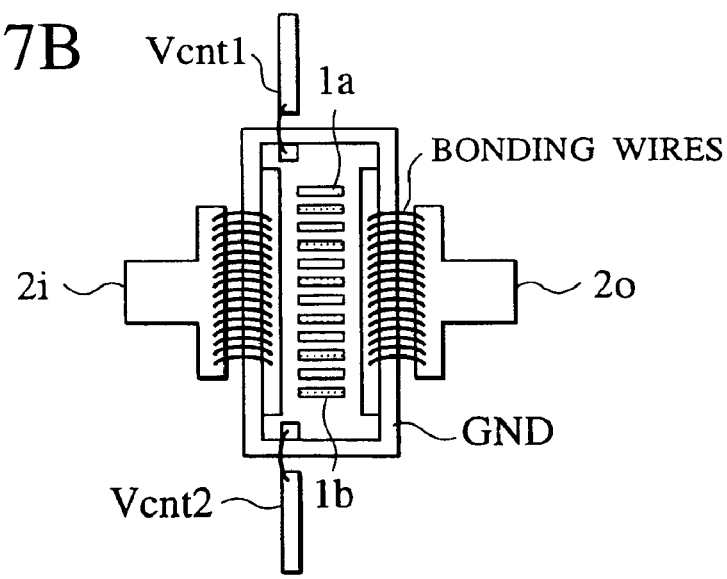

It is also possible to arrange the amplifier cells of different amplifier cell blocks in various ways. Namely, the amplifier cells of the high output amplifier cell blocks 1a and the low output amplifier cell blocks 1b can be arranged as upper and lower halves of the amplifier cells as shown in FIG. 17A, or the amplifier cells of the high output amplifier cell blocks 1a and the low output amplifier cell blocks 1b can be arranged alternately as shown in FIG. 17B.

Figure 17C:
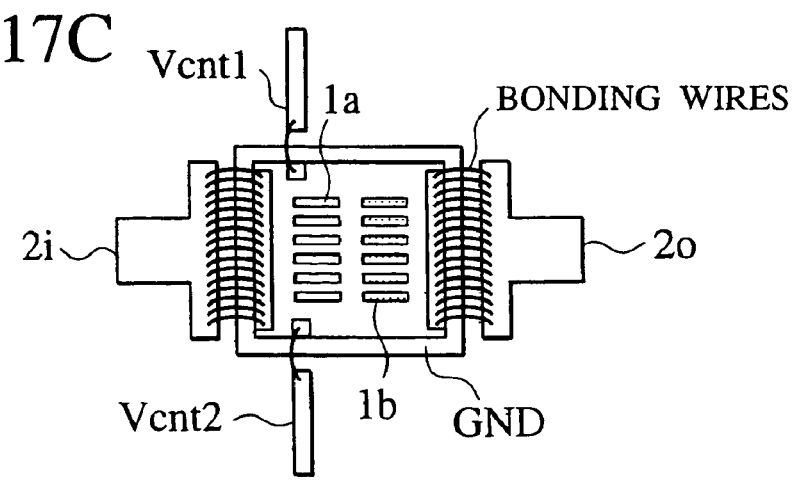
Figure 18A:
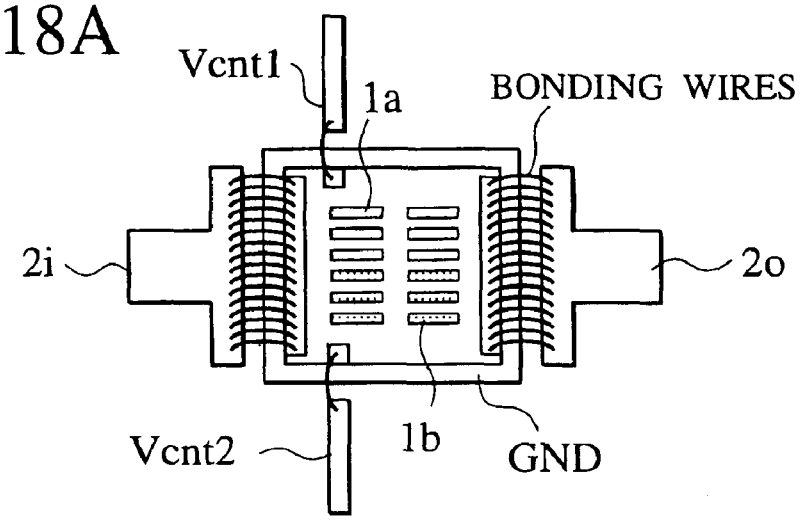
FIGS. 18A and 18B are diagrams showing exemplary configurations of a power amplifier using a high frequency circuit according to the fifth embodiment of the present invention.
Figure 18B:
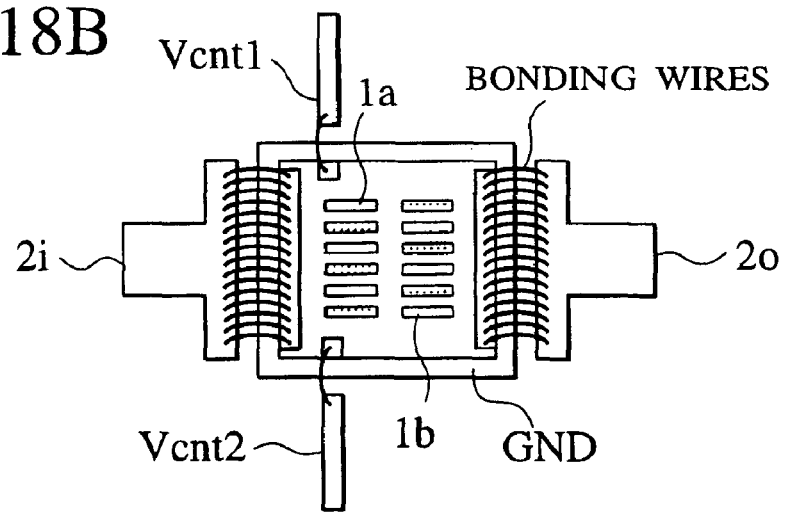

It is also possible to arrange the amplifier cells in more than one rows as shown in FIGS. 17C, 18A and 18B, depending on the chip shape. In the case of arranging the amplifier cells in two rows, the amplifier cells of the high output amplifier cell blocks 1a and the low output amplifier cell blocks 1b can be arranged in different rows as shown in FIG. 17C, or the amplifier cells of the high output amplifier cell blocks 1a and the low output amplifier cell blocks 1b can be arranged as upper and lower halves of the amplifier cells in both rows as shown in FIG. 18A, or the amplifier cells of the high output amplifier cell blocks 1a and the low output amplifier cell blocks 1b can be arranged in a zigzag pattern as shown in FIG. 18B.

In the case of using two amplifier cell blocks, only one of the high output amplifier cell block 1a and the low output amplifier cell block 1b is operated at any given moment, so that by arranging the heat generating amplifier cells of each amplifier cell block in a distributed form, it becomes possible to distribute the heat generation sources even when different amplifier cell blocks are arranged together, so that there is no need to thin the amplifier cell elements in order to deal with the heat generation or the ground inductance, and it becomes possible to minimize the increase of the chip area.

[Sixth Embodiment]

Figure 19A:
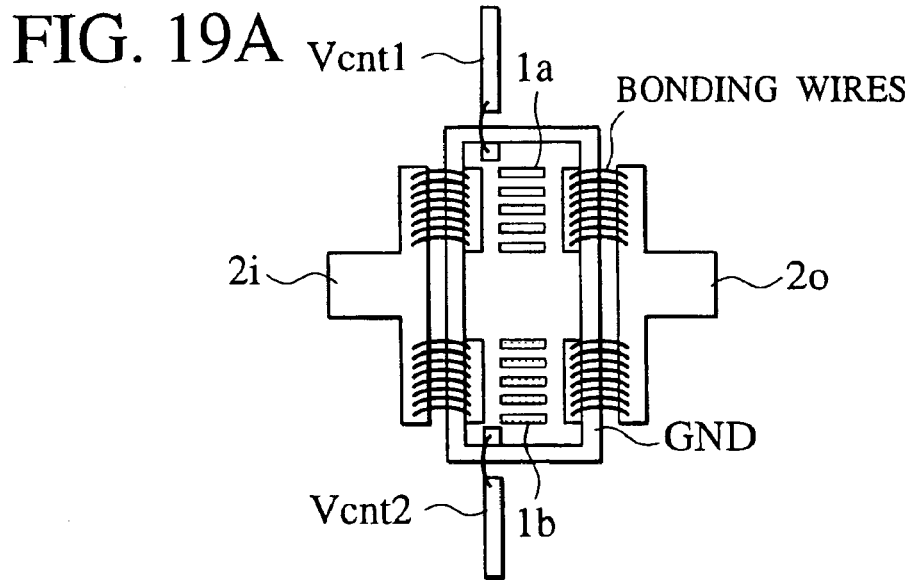
FIGS. 19A, 19B and 19C are diagrams showing exemplary configurations of a power amplifier using a high frequency circuit according to the sixth embodiment of the present invention.
Figure 19B:
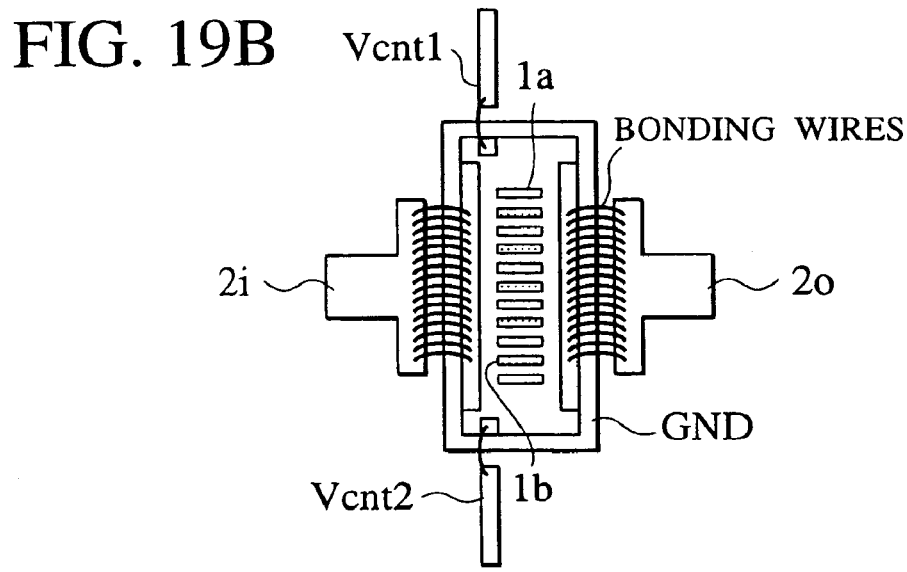
Figure 19C:
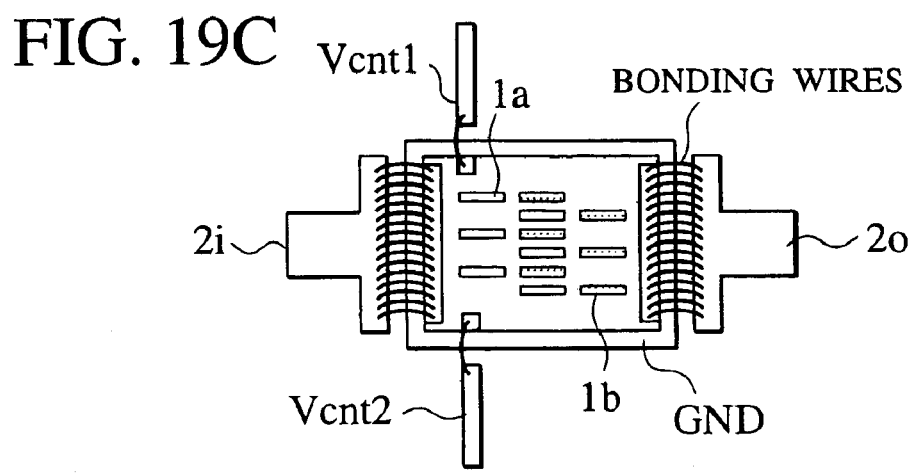

Next, the sixth embodiment of the present invention will be described in detail. FIGS. 19A, 19B and 19C show various configuration s of the power amplifier according to the sixth embodiment.

In the first to fifth embodiments described above, the the transistors of each amplifier cell block have the uniform size and the same impedance, and the input and output connection units are provided symmetrically, because the operation principle of the power amplifier of the present invention is based on the parallel shift of the load line using the bias voltage as shown in FIG. 6B.

However, in practice, the load line is not necessarily a straight line and the parallel shift of the load line with the fixed source and load impedances may not necessarily be optimal because of the influence of the knee voltage. In such cases, there is a need for the fine tuning of the source and load impedances in each amplifier cell block, which can be done as follows.

First, as shown in FIG. 19A, the input and output connection units 2i and 2o can be formed asymmetrically along a vertical direction (i.e., with respect to the high output amplifier cell block 1a and the low output amplifier cell block 1b). The fine tuning of the impedances can then be realized by changing widths or lengths of a pattern of a distributed constant lines of the input and output connection units 2i and 2o, changing lengths, numbers or intervals of the bonding wires, or by mounting chip parts.

Second, different transistor sizes can be used for different amplifier cell blocks. For example, as shown in FIG. 19B, the fine tuning of the impedances can be realized by setting the number of amplifier cells for the high output amplifier cell block 1a greater than that for the low output amplifier cell block 1b such that the transistor size of the high output amplifier cell block 1a becomes larger than that of the low output amplifier cell block 1b.

Third, the fine tuning of the impedances can be realized by devising the cell arrangement positions on the chip such that different amplifier cell blocks have different distances with respect to the matching circuits. For example, as shown in FIG. 19C, the arrangement of the high output amplifier cell block 1a can be biased toward the first connection unit 2i side, while the arrangement of the low output amplifier cell block 1b can be biased toward the second connection unit 2o side.

[Seventh Embodiment]

Next, the seventh embodiment of the present invention will be described in detail. This embodiment is directed to an application of the power amplifier according to the present invention to transmit and receive amplifiers used in a communication device of a radio system.

Figure 20A:
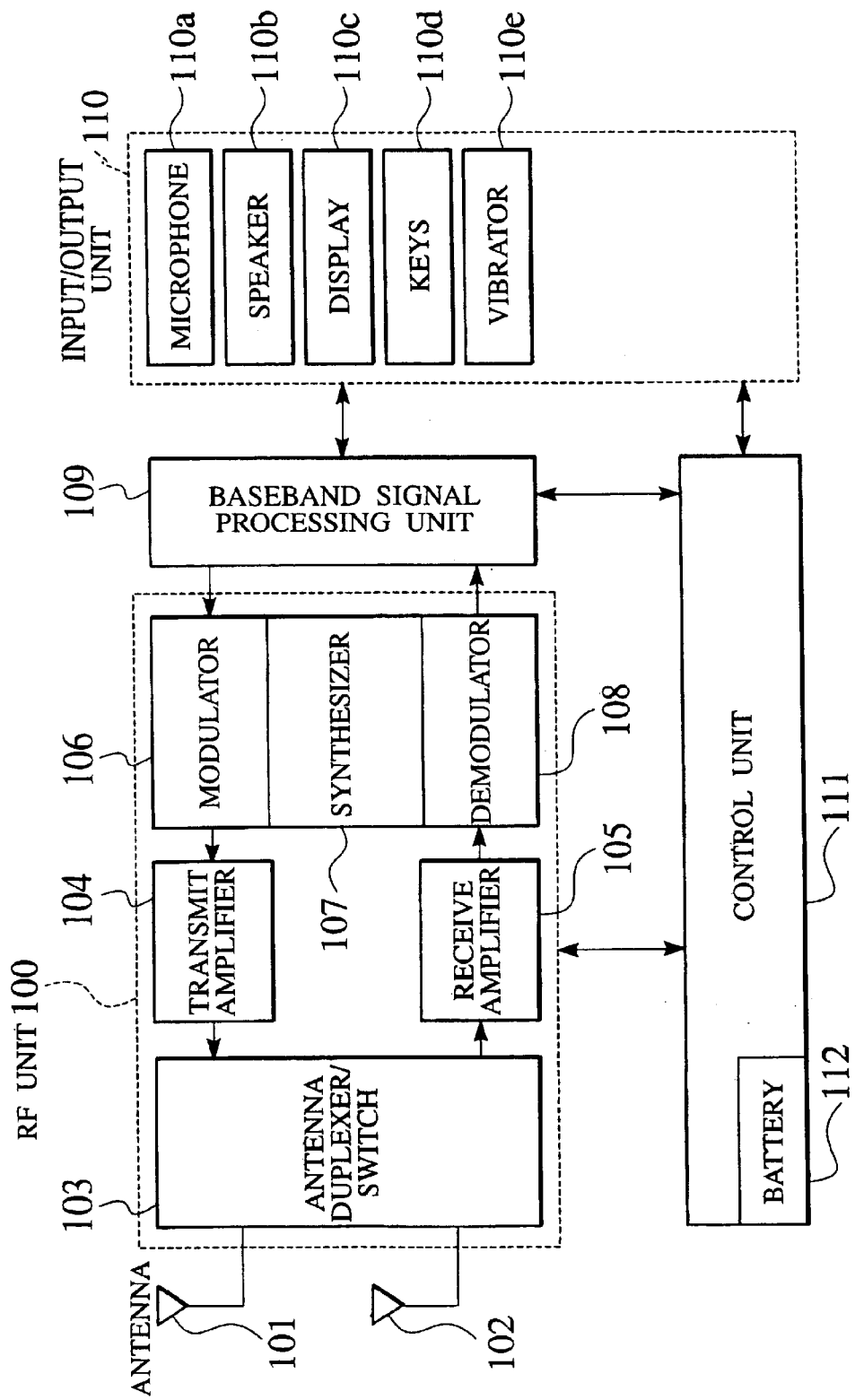

Namely, as shown in FIG. 20A, the communication device according to the present invention has a radio unit 100 which comprises antennas 101 and 102 for transmitting and receiving radio signals, an antenna duplexer/switch 103 for switching connection of the antennas 101 and 102, a transmit amplifier 104 and a receive amplifier 105 with the power amplifier of any of the above embodiments incorporated therein, a modulator 106 for modulating signals to be inputted into the transmit amplifier 104, a demodulator 108 for demodulating signals outputted from the receive amplifier 105, and a synthesizer 107 for carrying out a synchronization processing with a baseband signal processing unit 109.

The communication device of this embodiment also has the baseband signal processing unit 109 for carrying out a signal processing with respect to input/output signals of the radio unit 100, an input/output unit 110 for inputting/outputting input/output signals of the baseband signal processing unit 109 with respect to an external, a control unit 111 for controlling operations of the radio unit 100, the baseband signal processing unit 109 and the input/output unit 110, and a power source 112 for supplying power source voltages to the radio unit 100, the baseband signal processing unit 109 and the input/output unit 110. Note that the input/output unit 110 has a microphone 110*a* and keys 110*d* as input interface for receiving input speeches or operations from the external, and a speaker 110*b*, a display 110*c* and a vibrator 110*e* as output interface with respect to the external.

In this communication device, the input speeches or operation signals entered from the microphone 110*a* or keys 110*d* of the input/output unit 110 are applied with the signal processing at the baseband signal processing unit 109 under the control of the control unit 111, and entered into the transmit amplifier 104 through the modulator 106. These signals are amplified by the amplification processing as described above at the transmit amplifier 104 and transmitted from the antenna 101 or 102 through the antenna duplexer/switch 103.

On the other hand, radio signals received by the antenna 101 or 102 are amplified by the receive amplifier 105 through the antenna duplexer/switch 103 under the control of the control unit 111, and converted into control signals at the baseband signal processing unit 109 through the demodulator 108, to control the operations of the speaker 110*b*, the display 110*c* and the vibrator 110*e* of the input/output unit 110.

It is also possible to apply the power amplifier according to the present invention to a base station of a mobile communication system as shown in FIG. 20B.

Namely, as shown in FIG. 20B, the base station of the mobile communication system according to this embodiment has at least one radio unit 200 which comprises antennas 201 and 202 for transmitting and receiving radio signals, an antenna duplexer/switch 203 for switching connection of the antennas 201 and 202, a transmit amplifier 204 and a receive amplifier 205 with the power amplifier of any of the above embodiments incorporated therein, and a modem 206 for modulating signals to be inputted into the transmit amplifier 204 and demodulating signals outputted from the receive amplifier 205.

The base station of this embodiment also has a baseband signal processing unit 207 for carrying out a signal processing with respect to input/output signals of the radio unit 200, a transmission path connection unit 208 for inputting/outputting input/output signals of the baseband signal processing unit 207 with respect to an external, a control unit 209 for controlling operations of the radio unit 200, the baseband signal processing unit 207 and the transmission path connection unit 208, and a power source 210 for supplying power source voltages to the radio unit 200, the baseband signal processing unit 207 and the transmission path connection unit 208.

In this base station, the signals entered from the external are entered into the baseband signal processing unit 207 through the transmission path connection unit 208, applied with the signal processing at the baseband signal processing unit 207, and entered into the transmit amplifier 204 through the modem 206. These signals are amplified by the amplification processing as described above at the transmit amplifier 204 and transmitted from the antenna 201 or 202 through the antenna duplexer/switch 203.

On the other hand, radio signals received by the antenna 201 or 202 are amplified by the receive amplifier 205 through the antenna duplexer/switch 203, and converted into control signals at the baseband signal processing unit 207 through the modem 206 and outputted to the external through the transmission path connection unit 208.

The power amplifier of the present invention is suitable for a system that requires the power amplifier with a wide output power range. For example, it is effective for communications with a mobile station as described above or even for communications between fixed stations where the radio propagation environment can be easily changed. It is also effective in a mobile communication system such as a portable telephone system, especially a mobile communication system using the CDMA scheme that requires a wide dynamic range.

As described, according to the present invention, it is possible to realize a power amplifier capable of realizing a high efficiency operation over a wide output power range, without using variable voltage sources such as switches, variable matching circuits, DC-DC converters, etc. The high frequency circuit of the present invention can be mounted on MMIC (Monolithic Microwave Integrated Circuit) so that it can be utilized in the power amplifier for the portable telephone or the like which has a severe power consumption requirement, and it is possible to extend the continuous operation time of the portable telephone or the like considerably.

According to the present invention, the high output amplifier cell block is operated at a time of the high output and the low output amplifier cell block is operated at a time of the low output where the low output amplifier cell block has the maximum efficiency, so that it is possible to eliminate the wasteful power consumption by the high output amplifier cell block. Also, in the high output amplifier cell block, the amplifier cell blocks are connected in parallel AC-wise, and the voltage nearly equal to the input voltage is applied to the amplifier cells at nearly the same phase, so that it is possible to realize the high output amplification without causing a phase displacement among the amplifier cells. On the other hand, in the low output amplifier cell block, the amplifier cells are connected in series AC-wise, and a divided low voltage is applied to the amplifier cells at nearly the same phase, so that it is possible to realize the low output amplification without causing a phase displacement among the amplifier cells.

In addition, according to the present invention, only one of the amplifier blocks is put in the amplification operation state according to the output power while the other amplifier cell blocks are put in the high impedance non-operation state, so that the non-operating amplifier cell blocks can be regarded by the connection units as open capacitances with high impedances which do not affect the amplifier cell block in the operation state.

In particular, by increasing the number of steps of the amplifier cells to be connected in series with respect to the power source voltage, the output power with the maximum efficiency can be lowered by about 6 dB per one step. Moreover, the power amplifier in a compact size can be realized because the variable voltage sources such as switches, variable matching circuits, DC-DC converters, etc. are not required for the purpose of switching signal paths.

It is also to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A high frequency circuit, comprising:

a high output amplifier cell block configured to amplify input signals at a time of high output power, in which a DC power source voltage is supplied in parallel to first amplifier cells that are connected in parallel AC-wise with respect to input/output signals;

a low output amplifier cell block configured to amplify the input signals at a time of low output power, in which the DC power source voltage is supplied in series to second amplifier cells that are connected in parallel AC-wise with respect to the input/output signals;

a first connection unit configured to connect input sides of the high output amplifier cell block and the low output amplifier cell block with an input terminal from which the input signals are entered; and a second connection unit configured to connect output sides of the high output amplifier cell block and the low output amplifier cell block with an output terminal to which output signals are outputted;

wherein a number of the first amplifier cells is set equal to a number of the second amplifier cells.

2. The high frequency circuit of claim 1, wherein the high output amplifier cell block and the low output amplifier cell block are controlled by control voltages to put either one of the high output amplifier cell block and the low output amplifier cell block in an amplification operation state and another one of the high output amplifier cell block and the low output amplifier cell block in a high impedance state.

3. The high frequency circuit of claim 2, wherein the first and second connection units are formed by passive elements alone and configured to maintain a matching state with respect to the low output amplifier cell block when the high output amplifier cell block is in the high impedance state or a matching state with respect to the high output amplifier cell block when the low output amplifier cell block is in the high impedance state.

4. The high frequency circuit of claim 1, further comprising:

at least one middle output amplifier cell block configured to amplify the input signals at a time of middle output power, in which the DC power source voltage is supplied in parallel to third amplifier cells and in series to fourth amplifier cells that are connected in parallel AC-wise with respect to the input/output signals.

5. The high frequency circuit of claim 1, wherein the DC power source voltage is supplied from an output port side of the second connection unit.

6. The high frequency circuit of claim 1, wherein a common control voltage for controlling the high output amplifier cell block and the low output amplifier cell block is supplied from an input port side of the first connection unit.

7. The high frequency circuit of claim 1, wherein the high output amplifier cell block and the low output amplifier cell block are mounted on separate semiconductor chips.

8. The high frequency circuit of claim 1, wherein the high output amplifier cell block and the low output amplifier cell block are mounted on a single semiconductor chip.

9. The high frequency circuit of claim 8, wherein the first amplifier cells and the second amplifier cells are arranged in a distributed pattern over the single semiconductor chip.

10. The high frequency circuit of claim 1, wherein source and load impedances of each of the high output amplifier cell block and the low output amplifier cell block are fine tuned by forming the fist and second connection units asymmetrically with respect to the high output amplifier cell block and the low output amplifier cell block.

11. The high frequency circuit of claim 1, wherein source and load impedances of each of the high output amplifier cell block and the low output amplifier cell block are fine tuned by using different transistor sizes for the high output amplifier cell block and the low output amplifier cell block.

12. The high frequency circuit of claim 1, wherein source and load impedances of each of the high output amplifier cell block and the low output amplifier cell block are fine tuned by arranging the first amplifier cells and the second amplifier cells at different distances from matching circuits to be connected at an input side of the first connection unit and an output side of the second connection unit.

* * * * *